US012648187B2

(12) United States Patent
Sampath et al.

(10) Patent No.: US 12,648,187 B2
(45) Date of Patent: Jun. 2, 2026

(54) GATE TRENCH POWER SEMICONDUCTOR DEVICES HAVING TRENCH SHIELDING PATTERNS FORMED DURING THE WELL IMPLANT AND RELATED METHODS

(71) Applicant: Wolfspeed, Inc., Durham, NC (US)

(72) Inventors: Madankumar Sampath, Morrisville, NC (US); Sei-Hyung Ryu, Cary, NC (US); Naeem Islam, Morrisville, NC (US); Woongsun Kim, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 970 days.

(21) Appl. No.: 17/845,120

(22) Filed: Jun. 21, 2022

(65) Prior Publication Data

US 2023/0411446 A1 Dec. 21, 2023

(51) Int. Cl.
| | |
|---|---|
| *H10D 62/10* | (2025.01) |
| *H10D 12/01* | (2025.01) |
| *H10D 30/66* | (2025.01) |
| *H10D 62/17* | (2025.01) |
| *H10D 62/832* | (2025.01) |

(Continued)

(52) U.S. Cl.
CPC ......... *H10D 62/109* (2025.01); *H10D 12/031* (2025.01); *H10D 30/668* (2025.01); *H10D 62/393* (2025.01); *H10D 62/8325* (2025.01); *H10P 14/6308* (2026.01); *H10P 30/2042* (2026.01); *H10P 30/222* (2026.01)

(58) Field of Classification Search
CPC .. H10D 12/038; H10D 30/0297; H10D 62/60; H10D 62/102; H10D 62/107; H10D 62/125; H10D 62/8503; H10D 64/025

USPC ........................................................ 438/270
See application file for complete search history.

(56) References Cited

U.S. PATENT DOCUMENTS

| | | | |
|---|---|---|---|
| 9,887,287 B1 | 2/2018 | Lichtenwalner et al. | |
| 10,756,188 B2 | 8/2020 | Hiyoshi et al. | |

(Continued)

FOREIGN PATENT DOCUMENTS

| | | |
|---|---|---|
| JP | 2018110166 A | 7/2018 |
| JP | 2020057635 A | 4/2020 |

(Continued)

OTHER PUBLICATIONS

"H. Takaya, T. Misumi, H. Fujiwara and T. Ito, "4H-SIC Trench MOSFET with low on-resistance at high temperature," 2020 32nd International Symposium on Power Semiconductor Devices and ICs (ISPSD), 2020, pp. 118-121, doi: 10.1109/ISPSD46842.2020. 9170085.".

(Continued)

*Primary Examiner* — Fazli Erdem
(74) *Attorney, Agent, or Firm* — Myers Bigel, P.A.

(57) ABSTRACT

A wide band-gap semiconductor layer structure is provided that comprises a drift region having a first conductivity type and a plurality of source regions having the first conductivity type on the drift region. A plurality of trenches are provided in an upper surface of the wide band-gap semiconductor layer structure. Second conductivity type dopants are implanted into the wide band-gap semiconductor layer structure to simultaneously form well regions underneath the source regions and trench shielding regions underneath the trenches, the well regions and the trench shielding regions each having a second conductivity type.

25 Claims, 14 Drawing Sheets

(51) Int. Cl.
　　*H10P 14/60*　　　(2026.01)
　　*H10P 30/20*　　　(2026.01)

(56)　　　　　　References Cited

U.S. PATENT DOCUMENTS

| 2012/0280255 | A1 | 11/2012 | Masuda et al. |
| 2013/0313635 | A1 | 11/2013 | Nakano |
| 2016/0099316 | A1 | 4/2016 | Arai et al. |
| 2022/0005947 | A1 | 1/2022 | Sugawara et al. |
| 2022/0052170 | A1* | 2/2022 | Zeng .................... H10D 64/513 |
| 2022/0130996 | A1 | 4/2022 | Islam et al. |
| 2022/0130997 | A1 | 4/2022 | Harrington et al. |

FOREIGN PATENT DOCUMENTS

| JP | 2021044517 | A | 3/2021 |
| WO | 2014115280 | A1 | 7/2014 |
| WO | 2016157606 | A1 | 10/2016 |

OTHER PUBLICATIONS

"J. Tan, J. A. Cooper and M. R. Melloch, "High-voltage accumulation-layer UMOSFET's in 4H-SIC," in IEEE Electron Device Letters, vol. 19, No. 12, pp. 487-489, Dec. 1998, doi: 10.1109/55.735755.".
"Notification of Transmittal of the International Search Report and the Written Opinion of the International Searching Authority, or the Declaration for corresponding International Application No. PCT/US2023/025240, mailing date: Oct. 17, 2023, (15 pages)".

\* cited by examiner

P-TYPE DOPANT IONS

N-TYPE DOPANT IONS

P-TYPE DOPANT IONS

GATE TRENCH POWER SEMICONDUCTOR DEVICES HAVING TRENCH SHIELDING PATTERNS FORMED DURING THE WELL IMPLANT AND RELATED METHODS

FIELD OF THE INVENTION

The present invention relates to power semiconductor devices and, more particularly, to power semiconductor devices having gate trenches and to methods of fabricating such devices.

BACKGROUND

A Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by setting a bias voltage that is applied to the gate electrode to be above or below a threshold value. When a MISFET is turned on (i.e., it is in its "on-state"), current is conducted through the channel region of the MISFET between the source region and drain regions. When the bias voltage is reduced below the threshold level, the current ceases to conduct through the channel region.

An n-type MISFET has source and drain regions that have n-type (electron) conductivity and a channel that has p-type (hole) conductivity. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween. A P-type MISFET has a "p-n-p" design and turns on when a gate bias voltage is applied to the gate electrode that is sufficient to create a conductive p-type inversion layer in the n-type channel region that electrically connects p-type source and drain regions. Herein, the terms "first conductivity type" and "second conductivity type" are used to indicate either n-type or p-type, where the first and second conductivity types are different. Thus, if a first region of a device has a first conductivity type and a second region of the device has a second conductivity type, this means either that the first region has n-type conductivity and the second region has p-type conductivity or, alternatively, that first region has p-type conductivity and the second region has n-type conductivity.

The gate electrode of a MISFET is separated from the channel region by a thin dielectric layer that is called a gate dielectric layer. Typically, power MISFETs implement the thin gate dielectric layer using an oxide layer such as a silicon oxide layer. A MISFET that includes an oxide gate dielectric layer is referred to as a Metal Oxide Semiconductor Field Effect Transistor ("MOSFET"), and the gate dielectric layer is referred to as a gate oxide layer. As oxide gate dielectric layers are almost always used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of the MOSFET is insulated from the channel region by the gate oxide layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with the small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

In some applications, MOSFETs may need to carry large currents and/or be capable of blocking high voltages. Such MOSFETs are often referred to as "power" MOSFETs. Power MOSFETs are often fabricated from wide band-gap semiconductor materials (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity.

Power semiconductor devices such as power MOSFETs can have a lateral structure or a vertical structure. In a device having a lateral structure, the terminals of the device (e.g., the drain, gate and source terminals for a power MOSFET) are on the same major surface (i.e., top or bottom) of a semiconductor layer structure. In contrast, in a device having a vertical structure, at least one terminal is provided on each major surface of the semiconductor layer structure (e.g., in a vertical MOSFET, the source may be on the top surface of the semiconductor layer structure and the drain may be on the bottom surface of the semiconductor layer structure). The semiconductor layer structure may or may not include an underlying substrate such as a growth substrate. Herein, the term "semiconductor layer structure" refers to a structure that includes one or more semiconductor layers, such as semiconductor substrates and/or semiconductor epitaxial layers.

The semiconductor layer structure of a power semiconductor device typically includes an "active region" that has one or more functional semiconductor devices that have a junction such as a p-n junction. The active region acts as a main junction for blocking voltage during reverse bias operation and providing current flow during forward bias operation. The power semiconductor device may also have an edge termination in a termination region of the semiconductor layer structure that is adjacent the active region. Typically, multiple power semiconductor devices are formed in/on a common semiconductor layer structure, and each power semiconductor device will typically have its own edge termination. After the semiconductor layer structure is fully processed, the resultant structure may be diced to separate the individual edge-terminated power semiconductor devices. Each power semiconductor device may have a unit cell structure in which the active region of each power semiconductor device includes a plurality of individual "unit cell" devices that are electrically connected in parallel and that together function as a single power semiconductor device.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complicated manufacturing process.

One failure mechanism for a power MOSFET is the so-called "breakdown" of the gate oxide layer. When power MOSFETs are in their conducting or "on" state, the gate oxide layer is subjected to high electric fields. The stress on the gate oxide layer caused by these electric fields generates defects in the oxide material that build up over time. When the concentration of defects reaches a critical value, a so-called "percolation path" may be created through the gate oxide layer that electrically connects the gate electrode to the source or drain region, thereby creating a short-circuit that can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case), and assumes a gate oxide layer having a certain thickness. As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but various performance parameters of a MOSFET may be a function of the thickness of the gate oxide layer and thus increasing the thickness of the gate oxide layer is typically not an acceptable way of increasing the lifetime of the gate oxide layer.

SUMMARY

Pursuant to some embodiments of the present invention, methods of fabricating a semiconductor device are provided. Pursuant to these methods, a wide band-gap semiconductor layer structure is provided that comprises a drift region having a first conductivity type and a source region having the first conductivity type on the drift region, the wide band-gap semiconductor layer structure comprising a trench therein. Second conductivity type dopants are implanted into the wide band-gap semiconductor layer structure to simultaneously form both a well region underneath the source region and a trench shielding region underneath the trench, the well region and the trench shielding region each having a second conductivity type.

In some embodiments, the trench may extend through the source region and into the drift region.

In some embodiments, the second conductivity type dopants may be implanted through the source region into the drift region.

In some embodiments, the well region may be formed by converting a portion of the drift region having the first conductivity type into the well region having the second conductivity type.

In some embodiments, the well region may separate the source region from the drift region.

In some embodiments, the source region may form an upper portion of both a first sidewall and a second sidewall of the trench and the drift region may form a lower portion of the first sidewall and the second sidewall, where the first sidewall faces the second sidewall.

In some embodiments, the first sidewall of the trench may be exposed when the second conductivity type dopants are implanted into the wide band-gap semiconductor layer structure.

In some embodiments, the method may further comprise performing an oxidation process to convert at least the first and second sidewalls and a bottom of the trench into an oxide material and removing the oxide material to convert the trench into an enlarged trench.

In some embodiments, the wide band-gap semiconductor layer structure may extend in a length direction, a width direction and a depth direction that are perpendicular to each other, and a lower surface of the wide band-gap semiconductor layer structure may extend in the length and width directions.

In some embodiments, the source region may extend a first distance in the depth direction and the shielding region may extend a second distance in the depth direction, where the second distance exceeds the first distance.

In some embodiments, the second distance may be at least 1.5 times or at least twice the first distance.

In some embodiments, a portion of the well region that extends to an upper surface of the wide band-gap semiconductor layer structure may extend a third distance in the depth direction, and the third distance may be substantially the same as the second distance.

In some embodiments, a concentration of second conductivity type dopants in the source region may be at least $5 \times 10^{15}/cm^3$.

In some embodiments, a doping profile of the second conductivity type dopants in a portion of the well region that is underneath the source region varies by less than 15% from a doping profile of the second conductivity type dopants in a lower portion of the shielding region that extends longitudinally underneath a center of the bottom of the trench.

In some embodiments, the method may further comprise implanting additional second conductivity type dopants into the wide band-gap semiconductor layer structure underneath the trench.

In some embodiments, the second conductivity type dopants and the additional second conductivity type dopants may be implanted using a same ion implantation mask. In some embodiments, the additional second conductivity type dopants may be implanted before the second conductivity type dopants are implanted.

In some embodiments, the method may further comprise forming a mask on sidewalls of the trench before implanting the additional second conductivity type dopants into the wide band-gap semiconductor layer structure.

In some embodiments, an upper surface of the source region may be exposed when the additional second conductivity type dopants are implanted into the wide band-gap semiconductor layer structure.

In some embodiments, the method further comprises implanting additional second conductivity type dopants into the wide band-gap semiconductor layer structure underneath the trench. In some embodiments, the additional second conductivity type dopants may be implanted before an oxidation process is performed to convert at least the first and second sidewalls and a bottom of the trench into an oxide material.

In some embodiments, an upper surface of the source region may be exposed when the second conductivity type dopants are implanted into the wide band-gap semiconductor layer structure.

In some embodiments, providing the wide band-gap semiconductor layer structure comprises forming the drift region on an upper surface of a wide band-gap semiconductor substrate having the first conductivity type, implanting first conductivity type dopants ions into an upper surface of the drift region to form the source region, the source region having a higher concentration of first conductivity type dopants than the drift region, and forming the trench in an upper surface of the wide band-gap semiconductor layer structure.

In some embodiments, the method may further comprise implanting second conductivity type dopants into the semiconductor layer structure to form first and second support shields in the semiconductor layer structure on respective first and second sides of the trench.

In some embodiments, the method may further comprise sequentially forming a gate oxide layer and a gate electrode in the trench.

In some embodiments, the method may further comprise forming a trench shielding region connection region that electrically connects the trench shielding region to the well region.

Pursuant to further embodiments of the present invention, semiconductor devices are provided that comprise a wide band-gap semiconductor layer structure, the wide band-gap semiconductor layer structure comprising: a drift region having a first conductivity type; a well region having a second conductivity type on the drift region; a source region having the first conductivity type on the well region; a gate electrode within a trench; and a shielding region having the second conductivity type underneath the gate trench, where a doping profile of the second conductivity type dopants in a portion of the well region that is underneath the source region varies by less than 15% from a doping profile of the second conductivity type dopants in a lower portion of the shielding region that extends longitudinally underneath a center of the bottom of the trench.

In some embodiments, the well region may be between the drift region and the source region, and the trench may extend through the source region and the well region and into the drift region.

In some embodiments, the semiconductor layer structure may extend in a length direction, a width direction and a depth direction that are perpendicular to each other, and a lower surface of the semiconductor layer structure may extend in the length and width directions.

In some embodiments, the source region may extend a first distance in the depth direction and the shielding region may extend a second distance in the depth direction, where the second distance exceeds the first distance.

In some embodiments, the second distance may be at least 1.5 times or at least twice the first distance.

In some embodiments, the semiconductor device may further comprise first and second support shields that have the second conductivity type in the wide band-gap semiconductor layer structure on respective first and second sides of the trench, where the first and second support shields extend closer to a bottom surface of the wide band-gap semiconductor layer structure than does the shielding region.

In some embodiments, a concentration of second conductivity type dopants in an upper portion of the shielding region may exceed the concentration of second conductivity type dopants in the source region.

In some embodiments, an average concentration of second conductivity type dopants in an upper half of the shielding region may exceed an average concentration of second conductivity type dopants in a lower half of shielding region.

In some embodiments, the drift region, the well region, the source region and the shielding region comprise silicon carbide.

Pursuant to further embodiments of the present invention, semiconductor devices are provided that comprise a wide band-gap semiconductor layer structure, the wide band-gap semiconductor layer structure comprising: a drift region that has a first conductivity type; a well region having a second conductivity on the drift region; a source region having the first conductivity type on the well region; a gate electrode within a trench; and a shielding region having the second conductivity type underneath the trench, where the shielding region extends a first distance from a bottom of the trench downwardly into the semiconductor layer structure and the well region extends a second distance from a top surface of the semiconductor layer structure downwardly into the semiconductor layer structure, where the first distance is within +/−10% of the second distance.

In some embodiments, the well region may be between the drift region and the source region, and the trench may extend through the source region and the well region and into the drift region.

In some embodiments, the source region may extend a third distance from a top surface of the semiconductor layer structure downwardly into the semiconductor layer structure, and the first distance exceeds the third distance.

In some embodiments, the first distance is at least 1.5 times or at least twice the third distance.

In some embodiments, the semiconductor device may further comprise first and second support shields that have the second conductivity type in the wide band-gap semiconductor layer structure on respective first and second sides of the trench, where the first and second support shields extend closer to a bottom surface of the wide band-gap semiconductor layer structure than does the shielding region.

In some embodiments, a concentration of second conductivity type dopants in an upper portion of the shielding region may exceed a concentration of second conductivity type dopants in the source region.

In some embodiments, the drift region, the well region, the source region and the shielding region may comprise silicon carbide.

DETAILED DESCRIPTION

Figure 1:
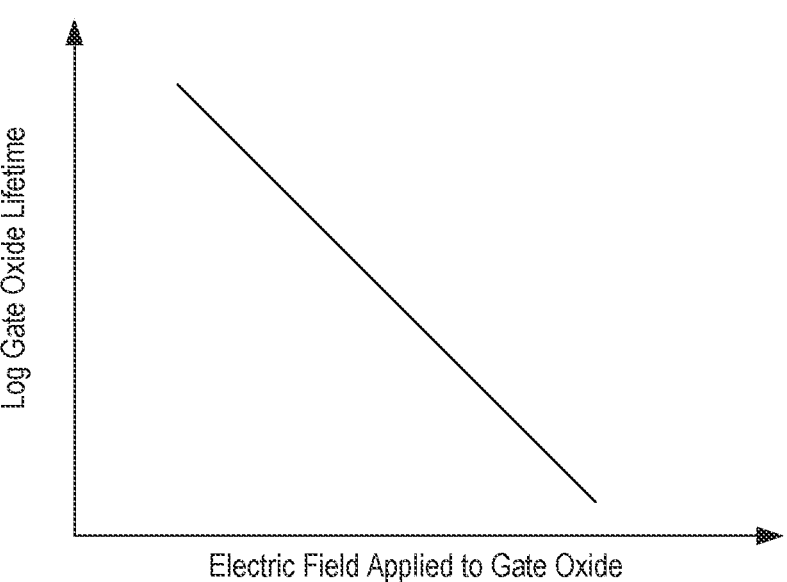
FIG. 1 is a schematic graph illustrating the relationship between the operating time until breakdown and the electric field level applied to the gate oxide layer of a power semiconductor device.

Vertical silicon carbide based power semiconductor devices that have gate trenches such as vertical power MOSFETs and IGBTs are attractive for many applications due to their inherent lower specific on-resistance, which may result in more efficient operation for power switching operations. Gate trench vertical power devices exhibit lower specific resistance during on-state operation because the channel is formed in the sidewall of the gate trench. Moreover, the carrier mobility in the sidewall channels of gate trench power devices may be about 2-4 times higher than the corresponding carrier mobility in the horizontal channel of a standard (i.e., non-gate trench) vertical power device. This increased channel mobility results in increased current density during on-state operation allowing for higher switching speeds. Furthermore, the trench design reduces the overall pitch of the device, allowing for increased integration. The lower conduction losses (due to the reduced on-state resistance) and improved switching speeds make gate trench power devices well-suited for high frequency power applications having low to moderate voltage blocking requirements (e.g., 600-1200 Volts). These devices may have reduced requirements for associated passive components, low cost, low weight and require relatively simple cooling schemes. As MOSFETs are the most widely used silicon carbide based trenched power semiconductor gate devices, the discussion below focuses primarily on MOSFET embodiments. It will be appreciated, however, that each of the described embodiments may alternatively be implemented using non-oxide gate dielectric layers (e.g., nitrides, high dielectric constant materials, etc.), and that the same techniques may be used to form other gate trench power semiconductor devices such as IGBTs, gate-controlled thyristors and the like.

Gate trench power MOSFETs are susceptible to oxide reliability issues due to the presence of high electric fields in the gate oxide layers that line the bottoms and sidewalls of the gate trenches. The high electric fields degrade the gate oxide layer over time, and may eventually result in failure of the device. The highest electric fields occur in corner regions of the gate oxide layer where electric field crowding effects can dramatically increase the levels of the electric field in the gate oxide layer. When gate trench MOSFETs operate in reverse blocking operation (i.e., when the MOSFET is in its off-state), the source terminal of the MOSFET is typically grounded, the gate terminal is typically grounded or at a negative bias voltage, and the drain terminal is typically at a high positive voltage. Under such reverse blocking operations, high electric fields extend upwardly from the drain terminal (which is on the bottom surface of the semiconductor layer structure) toward the top surface of the semiconductor layer structure. Thus, under reverse blocking operation, the bottom portion of the gate dielectric layer experiences the highest electric field levels. Due to electric field crowding effects, the electric field levels at the lower corners of the gate oxide layer at the bottom edges of the gate trench may be particularly high. Moreover, due to the difference in permittivity between silicon carbide and silicon oxide, the electric field in the silicon oxide gate dielectric layer may be about 2.6 times higher than the electric field in the adjacent silicon carbide. Breakdown of the silicon oxide occurs when the electric field reaches a critical level Ecr. The MOSFET thus may be operated with the drain voltage at lower levels during reverse blocking operation to ensure that the electrical field does not reach a level that will result in breakdown.

So-called "trench shielding regions" are often provided underneath the gate trenches of conventional gate trench power MOSFETs in order to reduce the electric field levels in the gate oxide layer during reverse blocking operation. These trench shielding regions comprise highly doped semiconductor layers having the same conductivity type as the channel region of the device. The trench shielding regions may, for example, extend downwardly 0.5 to 1.0 microns or more from the bottom surface of the gate trench into the semiconductor layer structure of the device. The protection that these trench shielding regions provide to the gate oxide layer increases as with increasing depth of the trench shielding region. The trench shielding regions may also extend laterally farther than the sidewalls of the trenches and/or may extend along the lower sides of the trenches in some cases. The trench shielding regions are electrically connected to the source terminal of the MOSFET by trench shielding region connection patterns. The trench shielding regions are typically formed via an ion implantation process into the bottom surfaces of the gate trenches. However, if the channel regions in the sidewalls of the gate trenches are not masked during this ion implantation process, the doping concentration of the channel regions may be negatively affected by the implant process, lowering device performance. As will be discussed below, pursuant to embodiments of the present invention, the same implant may be used to form both the channel regions and the trench shielding regions, which allows foregoing any masking step (which increases fabrication costs) while also allowing for deeper trench shielding regions.

FIGS. 2A-2G and 2I are schematic vertical cross-sectional views illustrating a method of fabricating a conventional silicon carbide-based gate trench vertical power MOSFET 1. FIG. 2H is a schematic horizontal cross-sectional view of the gate trench vertical power MOSFET 1. Herein, a vertical cross-sectional view of a power semiconductor device refers to a view of a cross-section taken through the device along a plane that is perpendicular to a major surface of the semiconductor layer structure of the device. Similarly, a horizontal cross-sectional view of a power semiconductor device refers to a view of a cross-section taken through the device along a plane that is parallel to a major surface of the semiconductor layer structure of the device.

Figure 2A:
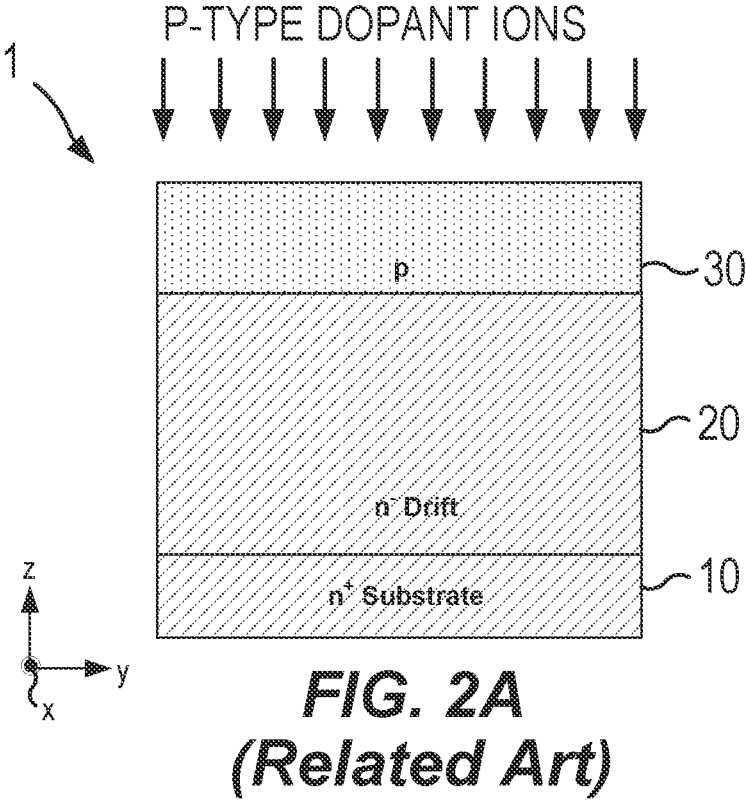
FIGS. 2A-2G and 2I are schematic vertical cross-sectional views and FIG. 2H is a schematic horizontal cross-sectional view that illustrate a method of fabricating a conventional gate trench power MOSFET.

As shown in FIG. 2A, a lightly-doped (n) silicon carbide drift region 20 is formed on a heavily-doped (n+) n-type silicon carbide substrate 10 by epitaxial growth. A moderately-doped (p) p-type silicon carbide well layer 30 is formed on the upper surface of the n-type drift region 20, either by epitaxial growth or, more commonly, by implanting p-type dopant ions into the upper portion of the n-type drift region 20.

Figure 2B:
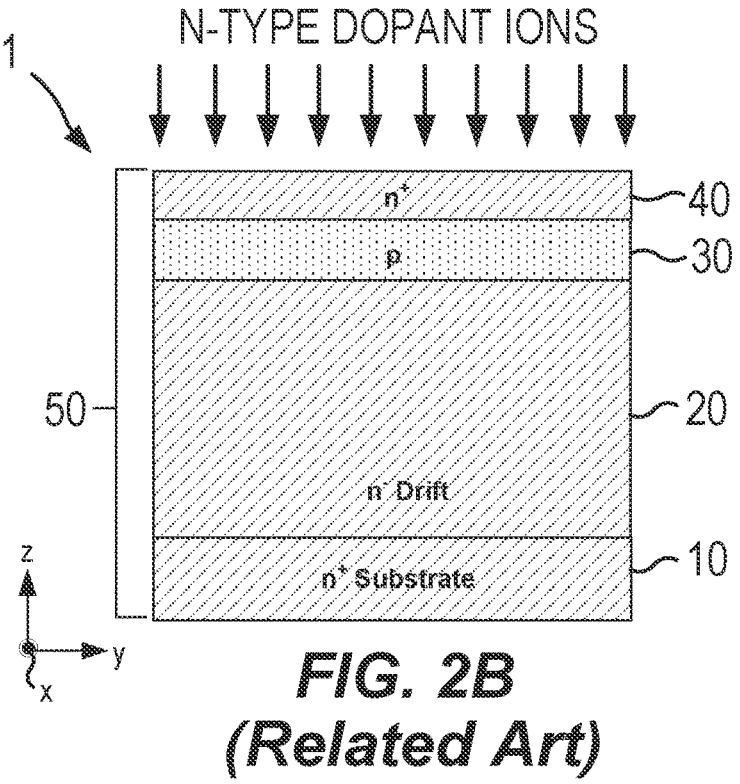

Referring to FIG. 2B, a heavily-doped n⁺ silicon carbide source layer 40 is formed in upper portions of the p-type silicon carbide well layer 30 by, for example, ion implantation. The silicon carbide substrate 10, drift region 20, well layer 30 and source layer 40, along with the various regions formed therein, comprise a semiconductor layer structure 50 of the power MOSFET 1.

Figure 2C:
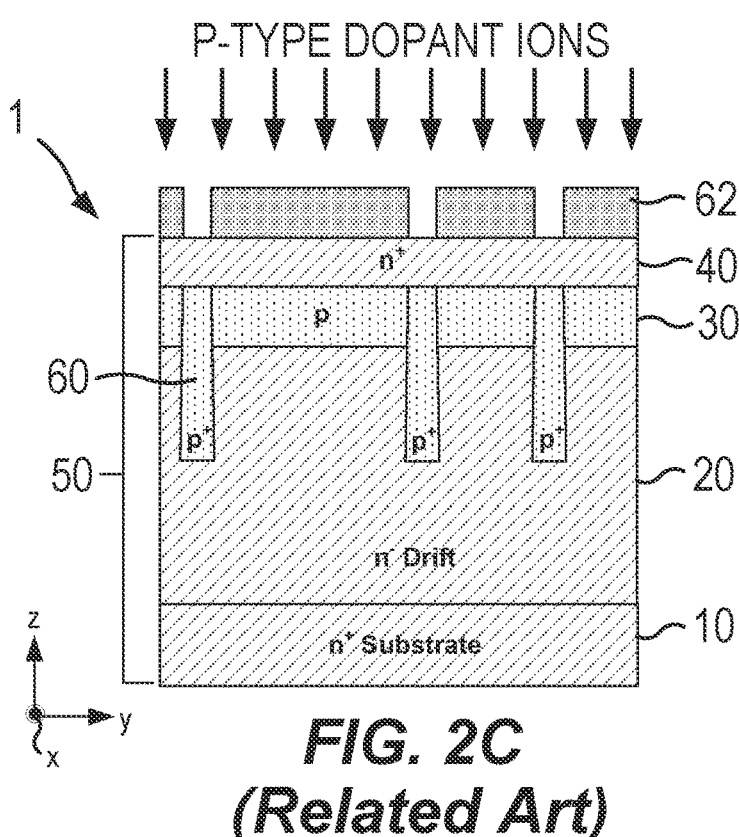

Referring to FIG. 2C, heavily-doped p⁺ silicon carbide trench support shields 60 are formed by implanting p-type dopant ions in the semiconductor layer structure 50. To form the trench support shields 60, an ion implantation mask 62 is formed on the upper surface of the semiconductor layer structure 50. As shown in FIG. 2C, the ion implantation mask 62 is patterned to form openings therein above the regions of the semiconductor layer structure 50 where the trench support shields 60 are to be formed. The trench support shields 60 are then formed by ion implantation, and the ion implantation mask 62 is thereafter removed. The trench support shields 60 may extend between 0.5 and 10 microns in the depth direction (the z-direction) into the semiconductor layer structure 50. The trench support shields 60 may alternatively be formed prior to formation of the source layer 40. The trench support shields 60 help reduce the electric field levels in the gate oxide layers (described below) of the MOSFET 1, which helps prevent premature breakdown of the gate oxide layer. The trench support shields 60 also provide a low-resistance current path between the source and drain terminals of the MOSFET 1 if the MOSFET experiences avalanche breakdown. This lower resistance current path helps reduce the amount that the device heats up during an avalanche breakdown event, increasing the likelihood that the MOSFET can survive such an event without damage.

Figure 2D:
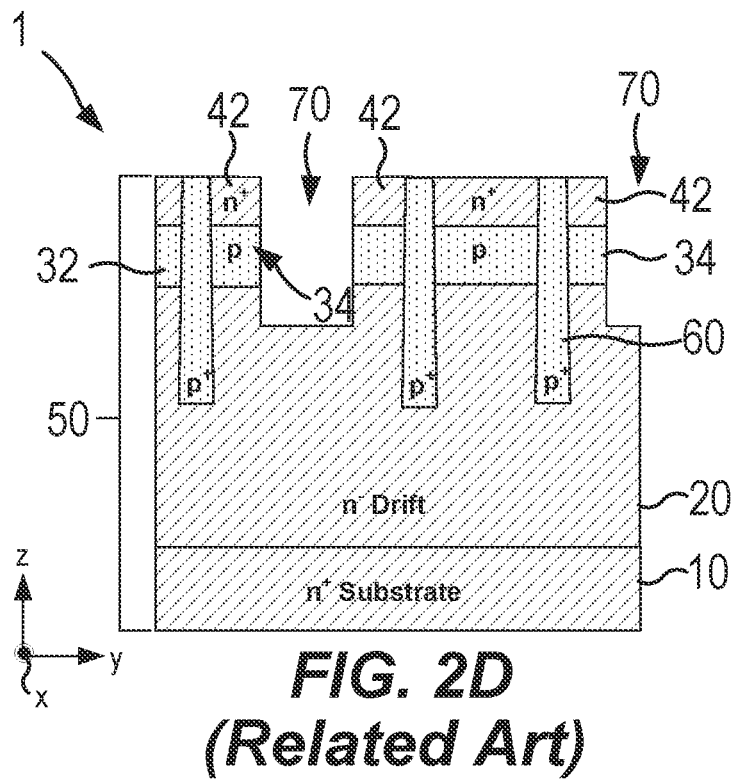

Referring to FIG. 2D, an etching process may then be carried out to form a plurality of gate trenches 70 in the upper surface of the semiconductor layer structure 50. Each gate trench 70 may extend laterally (i.e., parallel to a major surface of the semiconductor layer structure 50) in a first direction across the length (or width) of the power MOSFET 1. In FIGS. 2A-2G and 2I, the first direction is into the page and is indicated as being the x-direction. The gate trenches 70 may extend vertically in a third direction (i.e., perpendicular to a major surface of the semiconductor layer structure, which is indicated as being the z-direction) through the source layer 40 and well layer 30, and into the drift region 20, as shown, and the gate trenches 70 may be spaced apart from each other in a second direction (here the y-direction, which is perpendicular to the first direction and to the third direction). The gate trenches 70 convert the moderately-doped p-type silicon carbide well layer 30 into a plurality of moderately-doped p-wells 32 and convert the heavily-doped n-type silicon carbide source layer 40 into a plurality of heavily-doped n-type source regions 42. The portions of each p-well 32 that are adjacent the gate trenches 70 act as transistor channels 34, as will be discussed below.

Figure 2E:
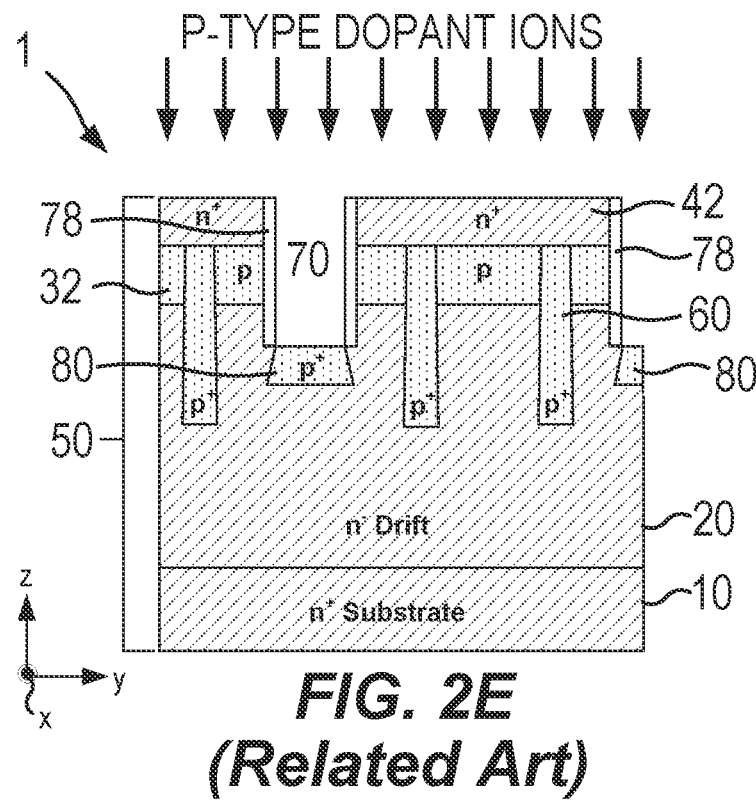

Referring to FIG. 2E, spacers 78 such as oxide spacers are formed on the sidewalls of the gate trenches 70. The spacers 78 may be formed by thermal oxidation of the silicon carbide or by depositing oxide and then performing a blanket etch (which will remove the oxide on the top surface of the semiconductor layer structure and the bottom of the trench while leaving most of the oxide spacers, since the horizontal surfaces will etch more quickly than the vertical surfaces). Heavily-doped (p⁺) p-type silicon carbide trench shielding regions 80 are then formed in the semiconductor layer structure 50 underneath each gate trench 70 via ion implantation by blanket implanting p-type ions into the upper surface of the semiconductor layer structure 50. Typically, the sidewalls of the gate trenches 70 will not be perfectly vertical so that an upper portion of each gate trench 70 is slightly wider than a lower portion thereof. For example, the sidewalls may be angled with respect to the bottom surface of the trench by 95-105° or more. As such, if the spacers 78 were not formed, then some p-type ions would be directly implanted into the sidewalls of the gate trenches 70. Additional p-type ions may scatter from the bottom surfaces of the gate trenches 70, and some of these ions would also implant into the sidewalls of the gate trenches 70. The spacers 78 may substantially prevent p-type ions from being implanted into the sidewalls of the gate trenches 70, thereby preventing the p-type ions that are implanted to form the trench shielding regions 80 from changing the doping concentration of the channel regions 34 and/or from converting the lower portions of the sidewalls, which are part of the n-type drift region 20, into p-type material.

Since the upper surface of the semiconductor layer structure 50 is exposed, relatively low ion implantation energies are used during the ion implantation step that is performed to form the trench shielding regions 80 so that the p-type dopants are only implanted a distance in the depth direction (the z-direction) that is less than or equal to a depth of the source regions 42 from the top surface of the semiconductor layer structure 50. This ensures that the implantation step used to form the trench shielding regions 80 does not substantially change the doping concentration of the well regions 32. The trench shielding regions 80 may extend the full length of the respective gate trenches 70 (e.g., along the x-direction).

Figures 2F, 2G:
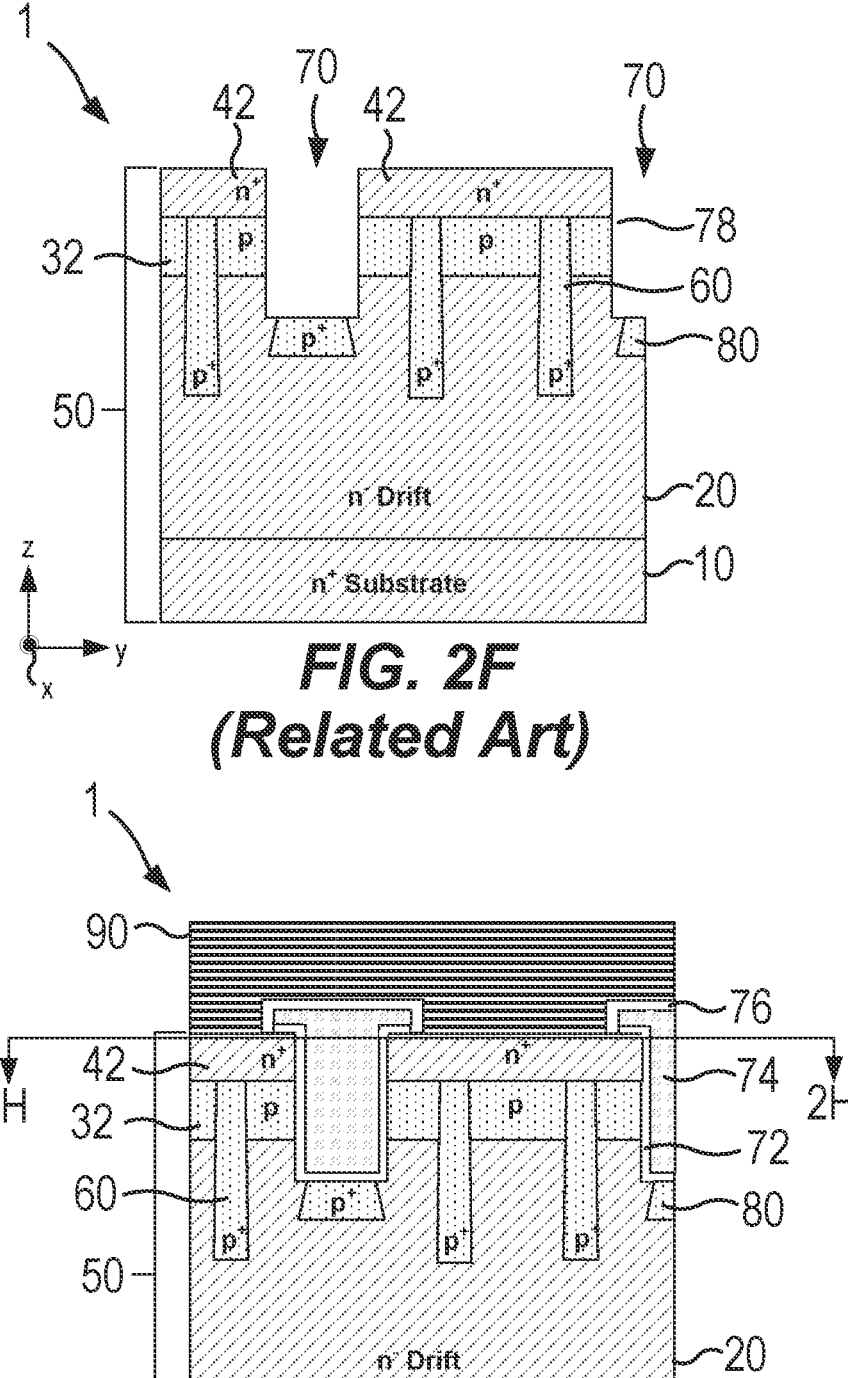
Figure 2H:
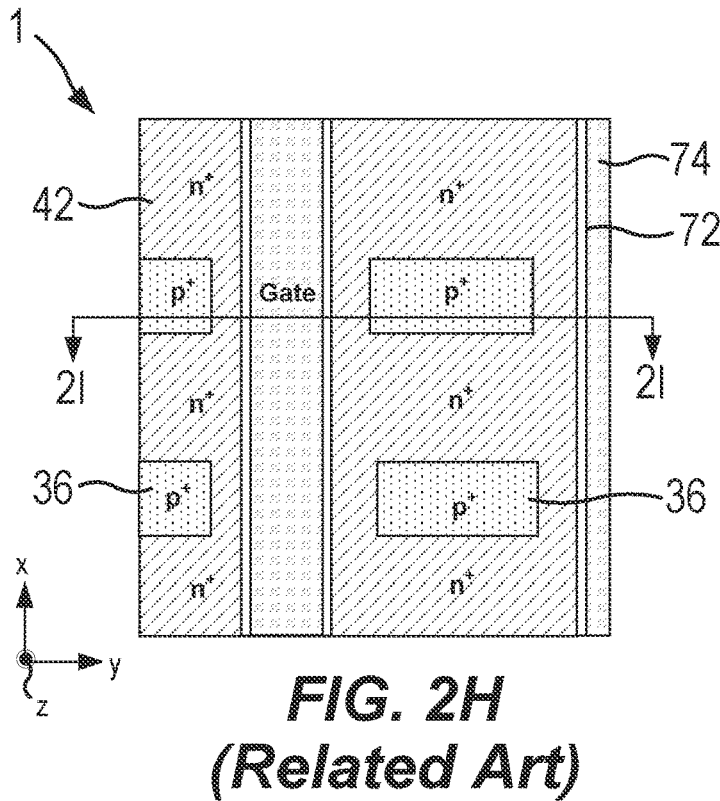

Referring to FIG. 2F, the sidewall spacers 78 may then be removed using an oxide etch.

Referring to FIG. 2G, a gate insulating layer 72 is formed on the bottom surface and sidewalls of each gate trench 70. Typically, the gate insulating layers 72 are oxide layers and hence will be referred to as gate oxide layers 72 herein. A gate electrode 74 is formed on each gate oxide layer 72 to fill the respective gate trenches 70. Inter-metal dielectric layers 76 are formed on the exposed portions of the gate electrodes 74, and a source contact 90 is formed on the upper portion of the device. The source contact 90 is physically and electrically connected to the n-type source regions 42. P-well extensions 36 physically and electrically connect the p-wells 32 to the source contact 90 in selected regions of the device (see the plan view of FIG. 2H) that are not visible in the cross-section of FIG. 2G. The source contact 90 may comprise the source terminal of the MOSFET 1 or may be electrically connected to the source terminal. A drain contact 92 is formed on the lower surface of the substrate 10. A gate contact (not shown) is also provided that is connected to the gate electrodes 74 outside the view of the cross-section of FIG. 2D, typically via one or more gate buses (not shown).

Figure 2I:
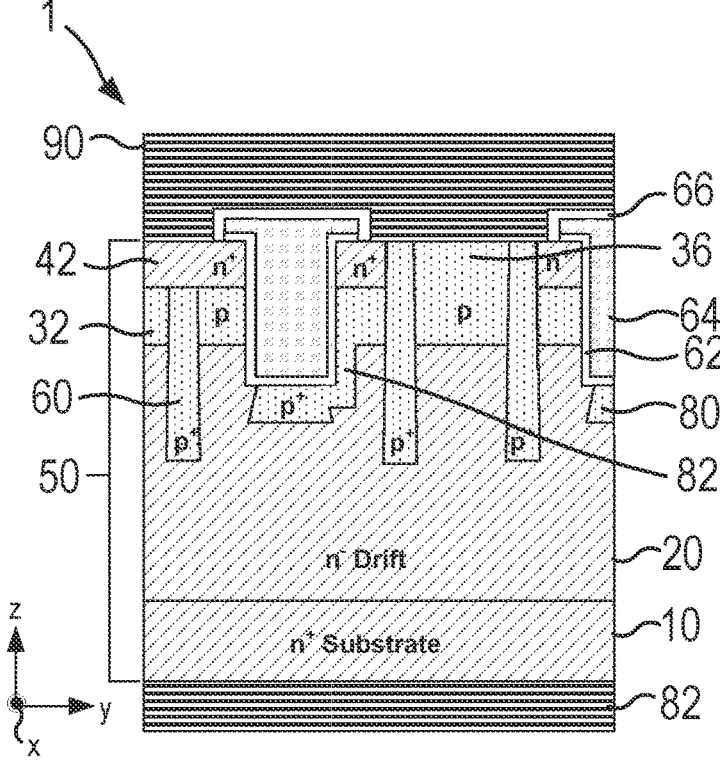

FIG. 2H is a horizontal cross-section taken through the device as shown in FIG. 2G along line 2H-2H (i.e., the cross-section is taken along the top surface of the semiconductor layer structure 50. FIG. 2H shows how the p-well extensions 36 comprise a series of islands that extend upwardly through the source regions 42 to the upper surface of the semiconductor layer structure 50. FIG. 2I is a vertical cross-sectional view taken along line 2I-2I of FIG. 2H that illustrates the p-well extensions 36 as well as a trench shielding region connection pattern 38 that electrically connects the illustrated trench shield region 80 to the p-well extensions 36. The trench shielding region connection pattern 38 and the p-well extensions 36 may be highly-doped (p⁺) p-type regions.

The trench shielding regions 80 help protect the corners of the gate oxide layers 72 from high electric fields during reverse blocking operation. There are, however, at least two potential disadvantages with the above-described conventional process for fabricating power MOSFET 1.

First, the doping concentration in the channel regions 34 of silicon carbide power MOSFET 1 is typically controlled very carefully to ensure optimum device performance. As such, steps are typically taken to ensure the ion implantation step that is performed to form the trench shielding region 80 does not change the doping concentration of the channel regions 34. In some cases this may be accomplished by forming an ion implantation mask over the source regions 42 (the mask blocks the p-type dopant ions from reaching the n-type source regions 42) during the ion implantation step used to form the trench shielding regions 80. However, forming and removing this ion implantation mask increases the time and cost of fabricating the device. As described above, in other cases, the masking step may be omitted, and instead the trench shielding regions 80 may be formed to extend in the depth direction a distance that is less than the depth of the source regions 42 (which also ensures that the doping concentration of the channel regions 34 are not increased). However, the shallow trench shielding regions 80 that are formed when no ion implantation mask is used provide less protection to the gate oxide layer 72 during reverse blocking operation, and hence the reliability of the MOSFET 1 may suffer when such shallow trench shielding regions 80 are used. While the support shielding regions 60 may improve the level of protection (and hence the reliability), forming these support shielding regions 60 requires additional processing steps, which increase fabrication time and cost, and still does not provide the same level of protection that is provided by deep trench shielding regions. The addition of the support shielding regions 60 may also reduce the integration density of the MOSFET 1.

Second, as described above, spacers 78 are formed on the sidewalls of the gate trenches 70 in order to prevent p-type ions from being implanted into the sidewalls of the gate trenches 70 during the ion implantation process that is used to form the trench shielding regions 80. Forming these spacers 78 requires extra processing steps as the spacer material must either be selectively deposited on the sidewalls or blanket deposited and then selectively removed from regions other than the sidewalls of the gate trenches 70. These extra steps increase processing time and cost.

Pursuant to embodiments of the present invention, improved techniques are disclosed for forming trench shielding regions in gate trench power semiconductor devices. In particular, the trench shielding regions may be formed, at least in part, during the ion implantation process that is used to form the well regions, and may be formed prior to formation of any source layer/region. In other words, the trench shielding regions and the p-wells can be formed simultaneously through a single ion implantation process. Since the p-wells are typically relatively deep structures, the processes according to embodiments of the present invention allow for the formation of relatively deep trench shielding regions. In some embodiments, the source layer is doped with first conductivity dopants and is doped substantially more heavily than the well regions and the trench shielding regions so that the second (opposite) conductivity type dopants that are implanted into the source layer during the ion implantation step used to form the well regions and the trench shielding regions does not materially impact the doping concentration of the source layer. In other embodiments, the source layer may be doped more heavily than desired so that extra first conductivity type dopants are present to counteract the second (opposite) conductivity type dopants that are implanted into the source layer during the ion implantation step used to form the well regions and the trench shielding regions.

Since the ion implantation step is used to form both the well regions and the trench shielding regions, there is no need for masking the semiconductor layer structure during the ion implantation step, while still having the ability to form much deeper trench shielding regions. Moreover, since the trench shielding regions may extend deeper into the semiconductor layer structure beneath the gate trenches, the ion implantation step used to form the well regions and the trench shielding regions may be performed, in some embodiments, without forming spacers on the sidewalls of the gate trenches. Instead, the ion implantation may be performed with the sidewalls of the gate trenches exposed, and thereafter the device may be subjected to an oxidation step that oxidizes exposed surfaces thereof (and hence oxidizes the portions of the sidewalls that were unintentionally implanted during the ion implantation step), and the oxide that is formed through this process may then be removed using an oxide etch. While this oxide etch will reduce the distance that each trench shielding pattern extends in the depth direction (since upper portions of the trench shielding patterns will be oxidized and then removed), this reduction is acceptable as these regions may be initially formed to extend much farther in the depth direction. Thus, the above techniques for fabricating the trench shielding regions may significantly simplify the device fabrication process Pursuant to some embodiments of the present invention, methods of fabricating a semiconductor device such as a power semiconductor device are provided. Pursuant to these methods, a wide band-gap semiconductor layer structure is provided that comprises a drift region having a first conductivity type and a plurality of source regions having the first conductivity type on the drift region. A plurality of trenches are provided in an upper surface of the wide band-gap semiconductor layer structure. The trenches may extend through the source region and into the drift region. Second conductivity type dopants are implanted into the wide band-gap semiconductor layer structure to simultaneously form well regions underneath the source regions and trench shielding regions underneath the trenches, the well regions and the trench shielding regions each having a second conductivity type.

The second conductivity type dopants may be implanted through the source region into the drift region in order to convert a portion of the drift region having the first conductivity type into the well region having the second conductivity type. In some cases, the sidewalls of the trenches may be exposed when the second conductivity type dopants are implanted into the wide band-gap semiconductor layer structure. In such embodiments, an oxidation process may be performed after the well regions and the trench shielding regions are formed to convert the sidewalls and bottom of the trench into an oxide material. The oxide material may then be removed to convert the trench into an enlarged trench. This oxidation and removal process may be used to eliminate portions of the sidewalls of the trenches that were unintentionally implanted during the formation of the well regions and the trench shielding regions.

In some embodiments, the source regions may extend a first distance in the depth direction and the shielding region may extend a second distance in the depth direction, where the second distance exceeds the first distance. For example, the second distance may be at least 1.5 times the first distance or at least twice or even three times the first distance. In some embodiments, a portion of the well region that extends to an upper surface of the wide band-gap semiconductor layer structure extends a third distance in the depth direction, and the third distance may be substantially the same as the second distance.

In some embodiments, a doping profile of a lower portion of the trench shielding region that is taken along a first axis that extends in the depth direction through a center of the bottom of the gate trench varies by less than 15% from a doping profile of the well region that is taken along a second axis that is parallel to the first axis and that extends through the well region.

Pursuant to further embodiments of the present invention, semiconductor devices are provided that comprise a wide band-gap semiconductor layer structure that includes a drift region having a first conductivity type, a well region having a second conductivity type on the drift region, a source region comprising the first conductivity type on the well regions, a gate electrode structure within a trench, and a shielding region comprising the second conductivity type underneath the gate trench. In some embodiments, the shielding region extends a first distance from a bottom of the trench downwardly into the semiconductor layer structure and the well region extends a second distance from a top surface of the semiconductor layer structure downwardly into the semiconductor layer structure, where the first distance is within +/−10% of the second distance (or within +/−5% of the second distance in other embodiments). In other embodiments, a doping profile of the second conductivity type dopants in a portion of the well region that is underneath the source region varies by less than 15% from a doping profile of the second conductivity type dopants in a lower portion of the shielding region that extends longitudinally underneath a center of the bottom of the trench.

Embodiments of the present invention will now be described in more detail with reference to FIGS. 3A-5. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other gate trench power semiconductor devices such as insulated gate bipolar transistors (IGBTs), gate controlled thyristors and the like.

Figure 3A:
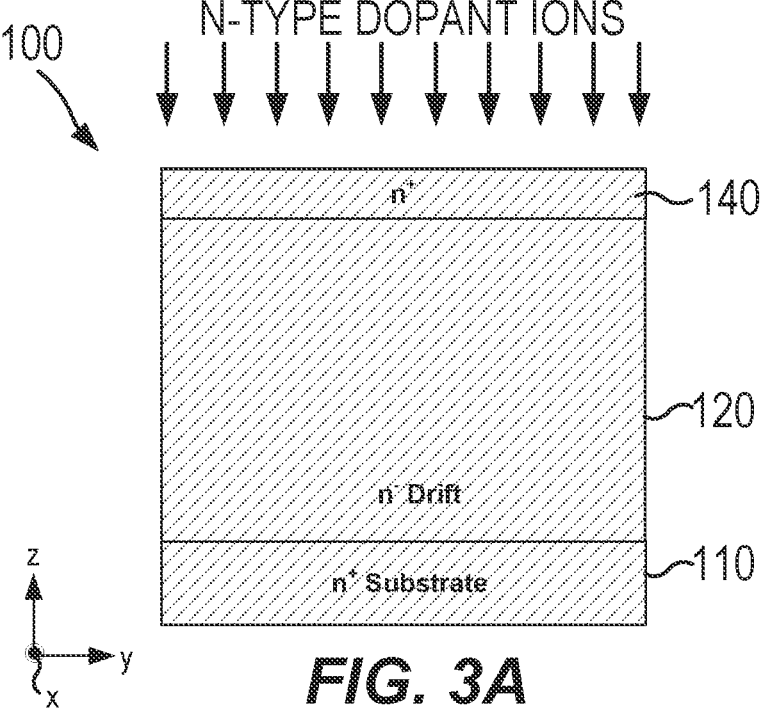
FIGS. 3A-3J and 3L are schematic vertical cross-sectional views and FIG. 3K is a schematic horizontal cross-sectional view that illustrate a method of fabricating a gate trench MOSFET according to embodiments of the present invention.
Figure 3B:
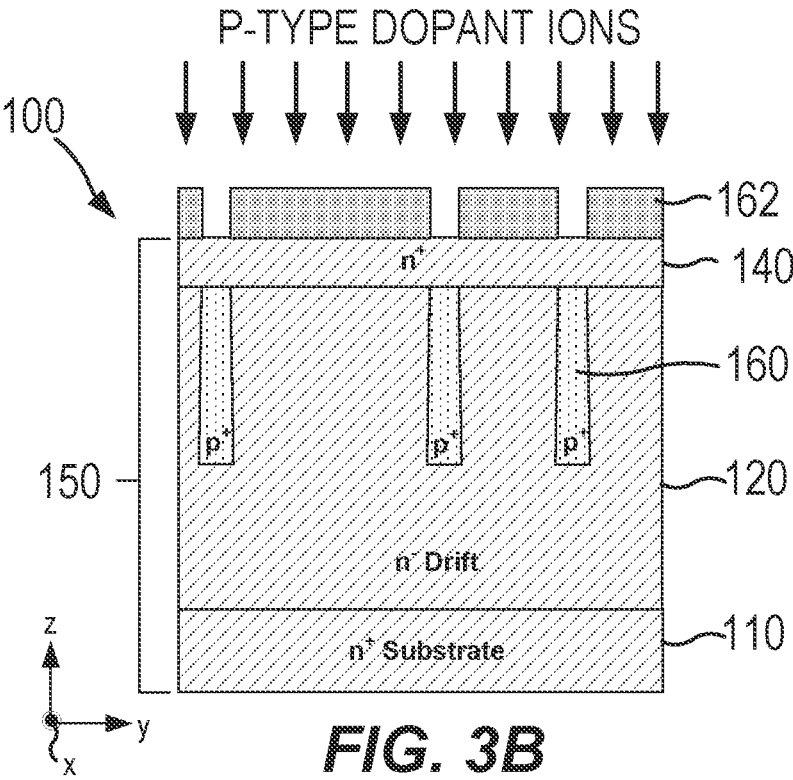
Figure 3C:
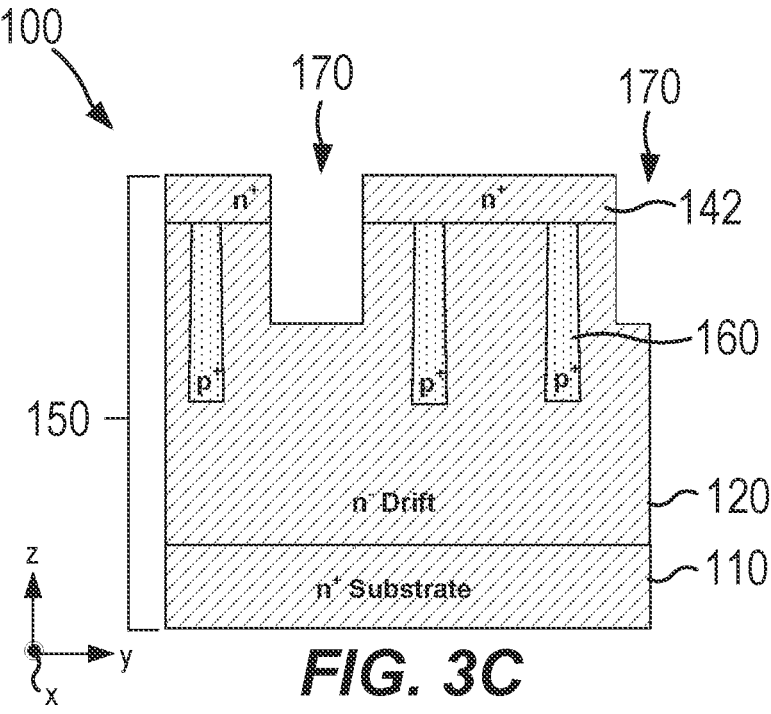
Figure 3D:
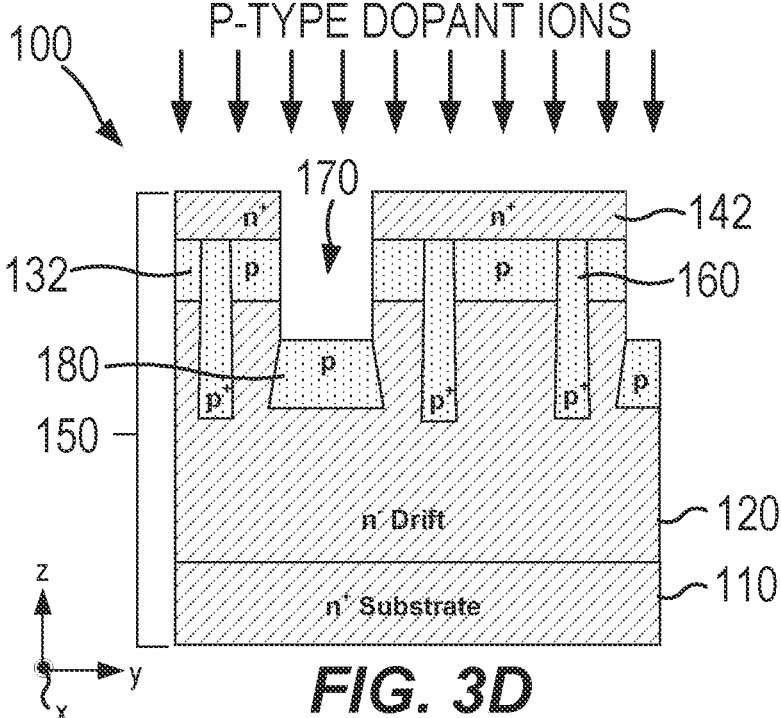
Figure 3E:
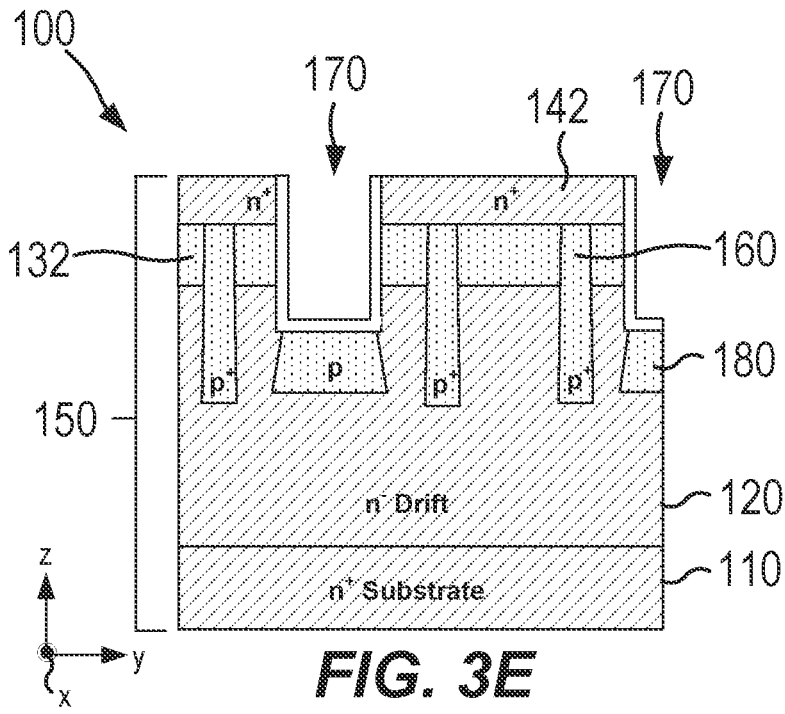
Figure 3F:
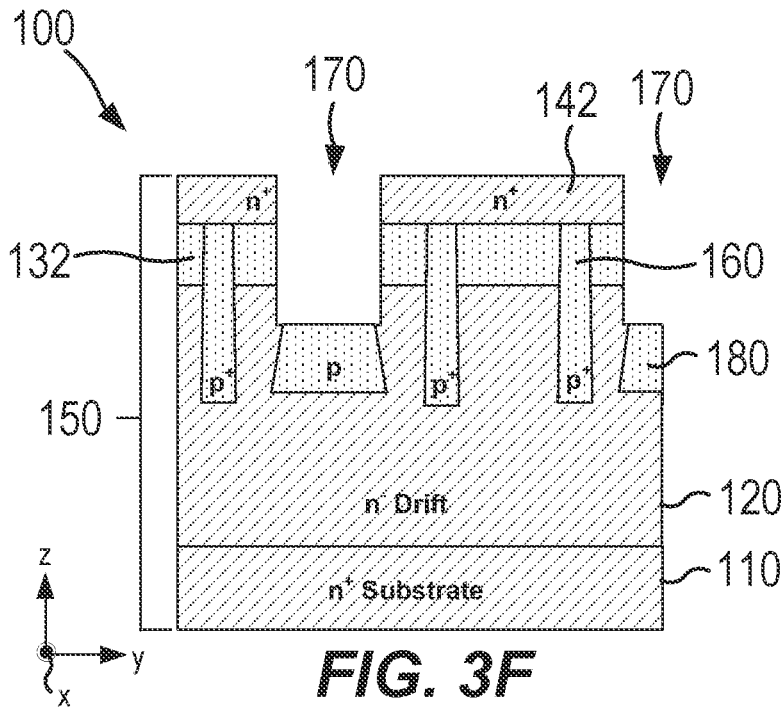
Figure 3G:
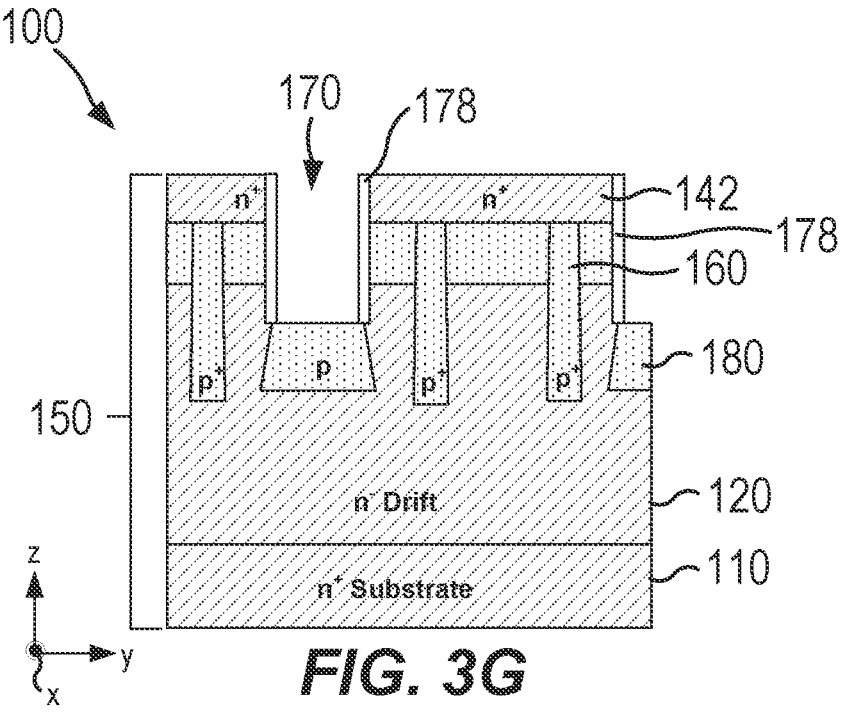
Figure 3H:
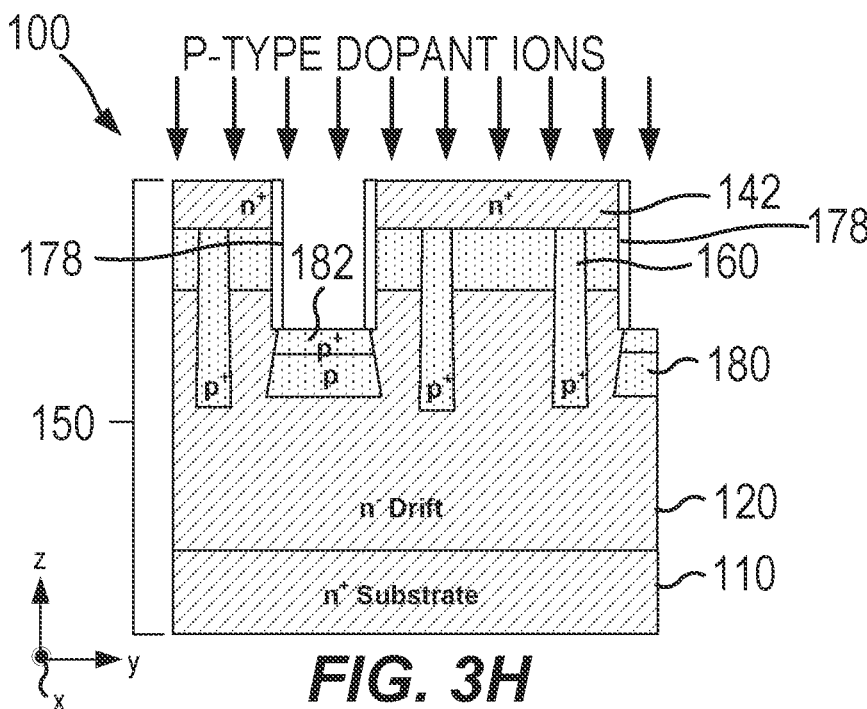
Figures 3I, 3J:
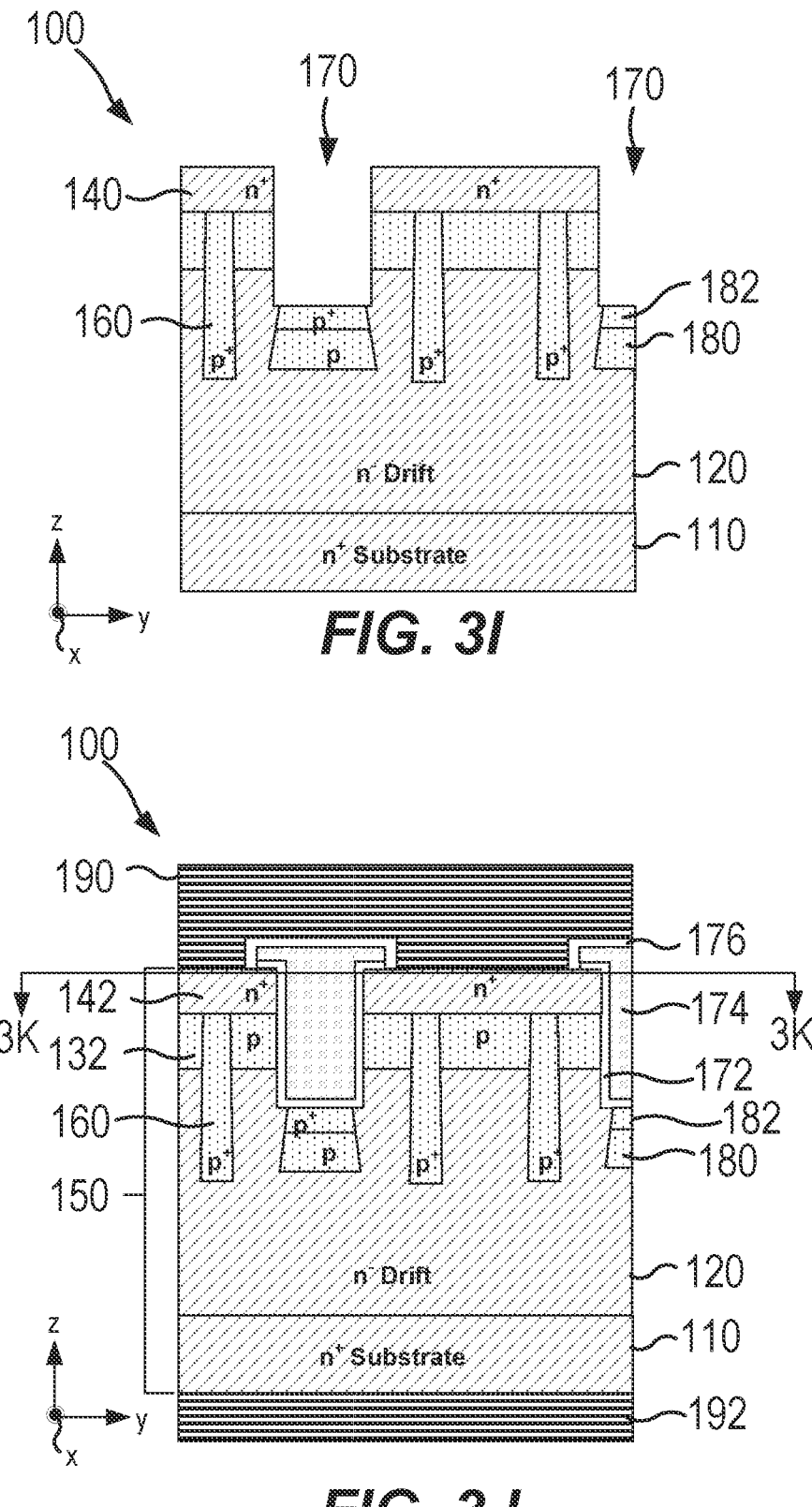
Figure 3K:
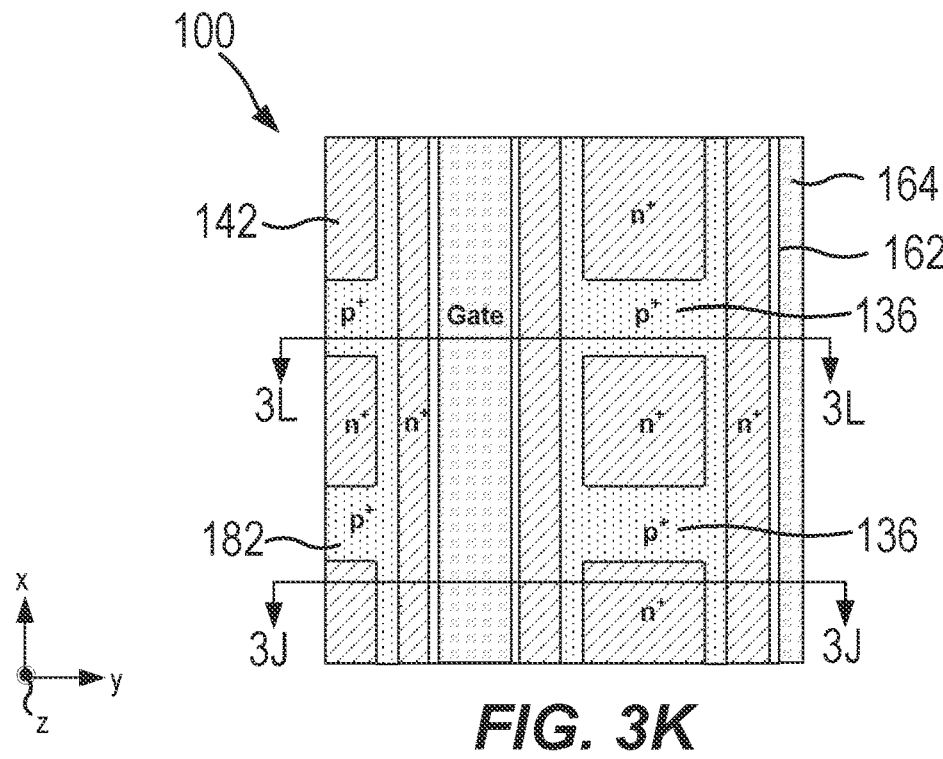
Figure 3L:
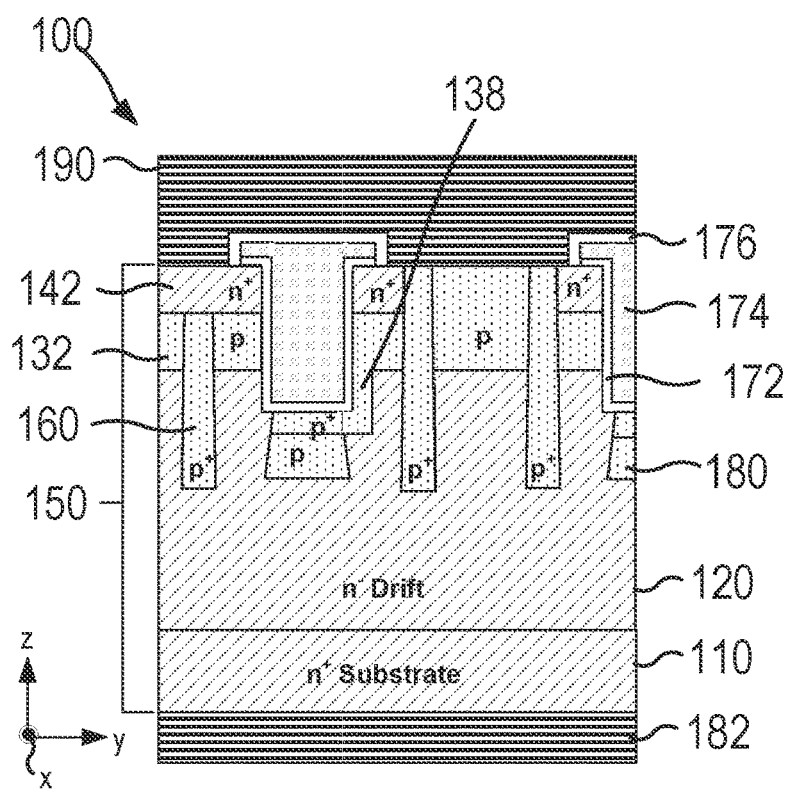

FIGS. 3A-3L are schematic cross-sectional views that illustrate a gate trench power MOSFET 100 according to embodiments of the present invention. More specifically, FIGS. 3A-3I are schematic vertical cross-sectional views that illustrate a method of fabricating the semiconductor layer structure of a gate trench power MOSFET 100. FIG. 3K is a schematic horizontal cross-sectional view of MOSFET 100 after metallization has been added, and FIGS. 3J and 3L are schematic vertical cross-sectional views taken along lines 3J-3J and 3L-3L of FIG. 3K, respectively.

Referring to FIG. 3A, an n-type silicon carbide substrate 110 is provided. The substrate 110 may comprise, for example, a 4H-silicon carbide or a 6H-silicon carbide substrate. In other embodiments, the substrate 110 may be or comprise a different semiconductor material (e.g., a Group III nitride-based material, silicon, gallium arsenide, zinc oxide, etc.) or a non-semiconductor material (e.g., sapphire). The substrate 110 may be heavily-doped ($n^+$) with n-type impurities (i.e., an $n^+$ silicon carbide substrate). The impurities may comprise, for example, nitrogen or phosphorous. The doping concentration of the substrate 110 may be, for example, between $1 \times 10^{18}$ atoms/cm$^3$ and $1 \times 10$ 21 atoms/cm$^3$, although other doping concentrations may be used. The substrate 110 may be relatively thick in some embodiments (e.g., 20-100 microns or more). It should be noted that while the substrates are shown in the figures as relatively thin layers, this is done to allow enlarging the thickness of other layers and regions in the figures, and it will be appreciated that the substrate will typically be much thicker than shown. The thickness of various other layers of the MOSFETs according to embodiments of the present invention likewise may not be shown to scale in order to allow other portions of the devices to be enlarged in the figures.

A lightly-doped ($n^-$) silicon carbide drift region 120 may be provided on the substrate 110. The n-type drift region 120 may be formed, for example, by epitaxial growth on the substrate 110. The n-type drift region 120 may have, for example, a doping concentration of $5 \times 10^{15}$ to $5 \times 10^{17}$ dopants/cm$^3$. The n-type drift region 120 may be a thick region, having a vertical height above the substrate 110 of, for example, 3-50 microns. In some embodiments, an upper portion of the n-type drift region 120 may comprise an n-type current spreading layer (not shown) that is more heavily doped than the lower portion of the n-type drift region 120.

A heavily-doped ($n^+$) n-type silicon carbide source layer 140 is formed in an upper region of the lightly-doped ($n^-$) silicon carbide drift region 120. The heavily-doped n-type silicon carbide source layer 140 is typically formed via ion implantation as this provides a more consistent doping density, but can alternatively be formed by epitaxial growth on the silicon carbide drift region 120. The heavily-doped n-type silicon carbide source layer 140 may have a doping concentration, for example, of between $1 \times 10^{19}$ atoms/cm$^3$ and $5 \times 10^{21}$ atoms/cm$^3$. The silicon carbide substrate 110, the drift region 120, and the source layer 140, along with the various regions/patterns formed therein such as a well regions and various shielding regions (discussed below), comprise a semiconductor layer structure 150 of the power MOSFET 100.

Referring to FIG. 3B, a mask 162 is formed on the supper surface of the source layer 140. The mask 162 is patterned to form openings that expose selected portions of the semiconductor layer structure 150. Then, an ion implantation process is performed to implant p-type dopants into the exposed portions of the semiconductor layer structure 150 to form trench support shields 160. The trench support shields 160 are p-type regions. The trench support shields 160 may have a maximum doping concentration of about $1 \times 10^{20}$, and may extend to a depth of between 0.5 and 10 microns from the upper surface of the semiconductor layer structure 150. If the trench support shields 160 are not provided, it is typically necessary to substantially increase the doping concentration of the trench shielding regions that are formed in a later processing step, and even with such an increased doping level, the electric fields on the gate oxide layers (discussed below) of the device will be higher. The ion implantation mask 162 is removed after the trench support shields 160 are formed.

Referring to FIG. 3C, a plurality of gate trenches 170 are formed via etching in an upper surface of the semiconductor layer structure 150. Although only one full gate trench 170 and a portion of a second gate trench 170 are shown in FIG. 3C, it will be appreciated that a large number of gate trenches 170 are typically provided, where each gate trench 170 extends in a first direction above the substrate 110 (here the gate trenches 170 extend in the x-direction), and the gate trenches 170 are spaced apart from each other in a second direction (here the y-direction) so that the gate trenches 170 extend longitudinally in parallel to each other. Each gate trench 170 has a length (corresponding to a distance in the x-direction), a width (corresponding to a distance in the y-direction), and a depth (corresponding to a distance in the z-direction). The length direction is the longest direction, and hence the longitudinal axis of each gate trench 170 refers to an axis that extends in the length direction down the middle of the gate trench 170. Each gate trench 170 has first and second opposed sidewalls and a bottom surface that each extend in the x-direction and hence extend parallel to the longitudinal axis.

While FIG. 3C illustrates a device that has a plurality of gate trenches that all extend in parallel to each other in a first direction, it will be appreciated that embodiments of the present invention are not limited thereto. Power MOSFETs having a wide variety of gate trench designs are known in the art. For example, some power MOSFETs have both a first set of gate trenches that extend in a first direction through a semiconductor layer structure and a second set of gate trenches that extend through the semiconductor later structure in a second (typically perpendicular) direction so that the trenches in the two sets intersect each other. As another example, some MOSFETs have gate trenches formed in rectangular, hexagonal, octagonal or circular shapes (when viewed from above) where the trenches surround well regions (with source regions therein). It will be appreciated that the techniques disclosed herein may be used on MOSFETs having any gate trench designs, including the example additional designs discussed above.

Each gate trench 170 extends in the z-direction (the depth direction) through the heavily-doped n-type silicon carbide layer 140 in order to convert the source layer 140 into a plurality of spaced apart heavily-doped n-type silicon carbide regions 142 that serve as the source regions of the power MOSFET 100. Each gate trench 170 also extends into an upper surface of the n-type drift region 120. The sidewalls of each gate trench 170 are the exposed surfaces of the layers/regions of the semiconductor layer structure 150 that are on either side of each gate trench 170.

Referring to FIG. 3D, an ion implantation process is performed to implant p-type dopant ions into the semiconductor layer structure 150. This ion implantation step may be performed without an ion implantation mask. The p-type dopants are implanted into and through the heavily-doped n-type source regions 142 and into the underlying drift region 120 to form a plurality of p-wells 132 in the upper portion of the drift region 120 underneath the source regions 142. The portion of each p-well 132 that is adjacent a gate trench 170 acts as transistor channel 134, as will be discussed below. The p-type dopants are also implanted into the portions of the drift region 120 that are underneath the bottom surfaces of the gate trenches 170 to form a plurality of trench shielding regions 180 that run underneath the respective gate trenches 170. This ion implantation step is performed using higher ion implantation energies than are used in the conventional process described above with reference to FIG. 2E, since the p-type dopants are implanted through the n-type source regions 142 to form the p-wells 132 thereunder. As such, the trench shielding regions 180 may be formed to extend much deeper into the semiconductor layer structure 150 than the trench shielding regions 80 that are formed in the conventional process described above. Note that herein the distance that a layer or region of a semiconductor layer structure extends in the depth direction refers to how far the layer or region extends in a direction that is perpendicular to the major surfaces of the semiconductor layer structure (i.e., how far the layer region extends in the vertical or "z" direction). The bottom of a region that is defined by its doping with a particular conductivity type dopant (such as a p-well 132 or the trench shielding regions 180) refers to a point where the doping concentration has fallen by two orders of magnitude from the peak doping concentration of the region. In example embodiments, the trench shielding regions 180 may extend in the depth direction 1.5 to 10 times farther than do the trench shielding regions 80 of MOSFET 1. The trench shielding regions 180 may extend in the depth direction 1.2 to 5 times more than the p-wells 132. Herein, the depth of a layer or region of a semiconductor layer structure refers to how far the layer or region extends in a direction that is perpendicular to the major surfaces of the semiconductor layer structure from a plane defined by the top surface of the semiconductor layer structure. The depth of trench shielding regions 180 may be more or less than the depth of the trench support shields 160, as shown in FIG. 3D. In an example embodiment, the trench shielding regions 180 may have a depth that is between 0.75 to 0.95 the depth of the trench support shields 160.

The p-wells 132 and at least the lower portions of the trench shielding regions 180 may be moderately doped p-type regions. The doping density of the p-type well regions 132 may be selected based on a desired doping density for the transistor channels of the MOSFET 100. In some embodiments, the moderately-doped p-type well layer 130 and the lower portions of the trench shielding regions 180 may each have a doping concentration of, for example, between $1 \times 10^{16}$ atoms/cm$^3$ and $1 \times 10^{19}$ atoms/cm$^3$. The moderately-doped p-type well layer 130 may have a graded doping profile in some embodiments.

Since the p-wells 132 and the trench shielding regions 180 are formed together (i.e., simultaneously) through the same ion implantation process, the doping profile of the p-type dopants in the p-wells 132 will substantially match (i.e., match within 15%) the doping profile of the p-type dopants in the lower portion of the trench shielding regions 180. Herein, a doping profile of a region of a semiconductor layer structure (e.g., the doping profile of a p-well or of a trench shielding region) refers to the variation in the concentration of a certain type of conductivity type dopants as a function of depth. Thus, the doping profile may be depicted graphically using a two dimensional graph that has a curve that shows the concentration of dopants of the specified conductivity-type as a function of distance in the depth direction from a reference plane such as, for example, the top surface of the semiconductor layer structure. It will be appreciated that doping profiles for a region are taken through a central portion of the region that does not abut another region as opposed to an edge portion of the region as edge effects may result in unintended variations in the doping profile that are not representative of the doping profile of the region.

The "variation" between two doping profiles refers to the variation between corresponding points on the two profiles. If two doping profiles have no variation, then if the graphical representations of the two doping profiles are overlapped the two curves will exactly overlap and appear as a single curve. This condition will rarely exist. Herein, references to a first doping profile varying by less than X % from a second doping profile means that the average difference in the two doping concentrations at each equivalent depth is less than X %. It should be noted that herein references are made to the variation between the doping profile of p-type dopants (or second conductivity type dopants) of a p-well 132 and the doping profile of p-type dopants (or second conductivity type dopants) of a lower portion of the trench shielding region 180 that was formed in the same process used to form the p-well 132. Here, the p-well 132 and the trench shielding region 180 are at different depths within the semiconductor layer structure 150 since the trench shielding region is formed underneath the gate trench 170. Thus, in comparing the variation between these two doping profiles, the depth of one of the curves is adjusted to account for the depth offset so that the two curves generally overlap.

It is anticipated that the doping profiles of p-type dopants in the p-wells 132 and the trench shielding regions 180 will show a small amount of variation because of effects that the gate trenches 170 may have on the ion implantation process, which is why the above-discussed doping profiles may not match exactly. Since the p-wells 132 are formed by implanting the p-type dopant ions through the n-type source regions 142, the doping profile of the p-type dopants in the n-type source regions 142 will also substantially match (i.e., match within 15%) the doping profile of the p-type dopants in the upper portion of the trench shielding regions 180. In some embodiments, the variation between the two doping profiles may be less than 10% or even less than 5%.

Figure 6:
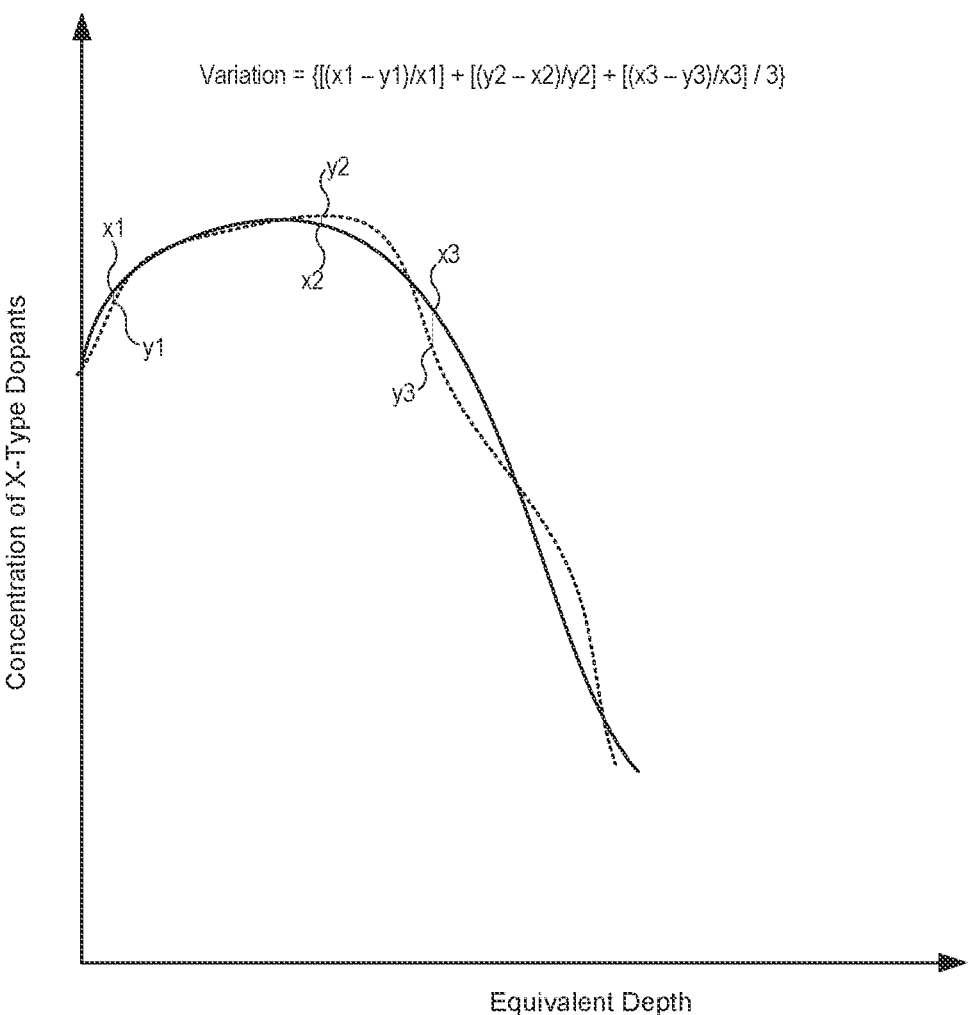
FIG. 6 is a schematic graph illustrating how the variation between two doping profiles may be determined.

FIG. 6 is a schematic graph that illustrates how the semiconductor devices according to embodiments of the present invention may have p-wells where a portion of the p-well that that is underneath the source region has a doping profile of p-type dopants that varies by less than 15% from a doping profile of p-type dopants in a lower portion of a trench shielding region (where the doping profile of the trench shielding region is taken through a portion of the trench shielding region that extends longitudinally underneath a center of the bottom of a gate trench). As shown in FIG. 6, the depth of the lower portion of the trench shielding region is adjusted by a constant offset so that the two curves appropriately align. The variation in the two doping profiles is then determined by taking an average of the variation in the doping concentration values at each point along the horizontal axis (e.g., at 100 hundred equally-spaced points). FIG. 6 exemplarily shows the average being taken at three points where the values of the p-well doping profile are labeled as x1, x2, x3 and the values of the trench shielding region doping concentration are labeled as y1, y2, y3.

The upper portion of each trench shielding region 180 (which corresponds to the portion extending from the bottom of the gate trench 170 into the drift region 120 a distance in the z-direction that is equal to a depth of the source regions 142) may have a higher p-type doping concentration than the remainder of each trench shielding region 180. The upper portion of each trench shielding region 180 may have a higher doping concentration since a higher concentration of p-type dopants may be implanted into the source regions 142 (and simultaneously implanted into the portions of the drift region that are converted into the upper portions of the trench shielding regions 180) without impacting the doping concentration of the well regions 132. In some cases, the dose of n-type dopants that are implanted to form the source regions (see discussion of FIG. 3A above) may be somewhat higher than necessary to achieve a desired effective n-type dopant concentration in the source regions 142, as the extra n-type dopants will balance out the p-type dopants that are implanted into the source regions 142 during the ion implantation step used to form the p-wells 132 and the trench shielding patterns 180. The trench shielding regions 180 may extend the full length of the respective gate trenches 170.

As discussed above, the sidewalls of the gate trenches 170 typically are not perfectly vertical, but instead slope outwardly with increasing distance from the bottom of each gate trench 170. As a result, some level of dopant ions will be directly implanted into the sidewalls of each gate trench 170 during the above-described ion implantation process that is performed to form the p-wells 132 and the trench shielding regions 180. Additionally, some amount of dopant ions will bounce off the exposed portions of the drift region 120 that are underneath each gate trench 170, and some of these "reflected" dopant ions will then implant into the sidewalls of the gate trenches 170. The implantation of p-type dopant ions into the sidewalls of the gate trenches through these two mechanisms during the ion implantation process that is performed to form the p-wells 132 and the trench shielding regions 180 may be problematic for two reasons.

First, as discussed above, the p-type doping concentration of the p-wells 132 may be carefully chosen so that the channel regions 134 will have a doping concentration for optimized device performance. If additional p-type dopant ions are implanted into the channel regions 134 during the ion implantation process that is performed to form the p-wells 132 and the trench shielding regions 180, then the performance of the MOSFET 100 may be degraded. Second, the lightly-doped n-type drift region 120 forms the lower portion of each sidewall of each gate trench 170. If sufficient p-type dopant ions are implanted into these n-type regions of the sidewalls of the gate trenches 170, the lower sidewalls can become effectively undoped or even doped p-type. If this occurs, the p-wells 132 may be short-circuited to the p-type trench shielding regions 180 and the unit cells will no longer operate as transistors. As described above, oxide spacers 78 are formed on the sidewalls of the gate trenches 70 to prevent dopant ions from being implanted into the sidewalls during the ion implantation process that is performed to form the trench shielding regions 80 during the fabrication process used to form conventional MOSFET 1. While this technique is effective, is complicates the manufacturing process.

FIGS. 3E and 3F illustrate processing steps that are performed to remove dopant ions that are implanted into the sidewalls of the gate trenches 170 during the ion implantation process that is performed to form the p-wells 132 and the trench shielding regions 180. Referring first to FIG. 3E, an oxidation process is performed on the MOSFET 100. The oxidation process oxidizes exposed surfaces of the semiconductor layer structure 150, including the top surface of the semiconductor layer structure 150 and the sidewalls and bottom surfaces of the gate trenches 170. The sidewalls of the gate trenches 170 may oxidize faster than the upper surface of the semiconductor layer structure 150 and the upper portions of the trench shielding regions 180 in some embodiments (e.g., in embodiments formed using a 4H silicon carbide substrate) since different faces of the silicon carbide crystal structure will oxidize at different rates. The oxidation process may be performed to oxidize the portions of the sidewalls of the gate trenches 170 that have had their doping concentration materially changed by the ion implantation process that is performed to form the p-wells 132 and the trench shielding regions 180.

Next, referring to FIG. 3F, an etching process is performed to remove the oxidized silicon carbide. This etching process acts to remove the portions of the sidewalls of the gate trenches 170 that were implanted during the ion implantation process that is performed to form the p-wells 132 and the trench shielding regions 180. The etching process also removes the oxidized top surface of the semiconductor layer structure 150 and a top portion of each trench shielding pattern 180.

Note that the oxidation and oxide removal steps described above with reference to FIGS. 3E and 3F act to widen the gate trenches 170. Thus, the gate trenches 170 may initially be formed to have a width in the y-direction that is less than a desired final width for the gate trenches 170.

In some cases, it may be desirable to further increase the doping concentration of the upper portion 182 of each trench shielding region 180. In some embodiments, a second ion implantation process may be performed in which p-type dopants are implanted into the upper surface of the semiconductor layer structure and into the bottom surfaces of the gate trenches 170. This ion implantation process may be a relatively low energy but high dosage ion implantation process. As a result, the p-type dopants are not deeply implanted and are implanted at a high dosage level. The energy of the implant may be set so that the dopant ions that are implanted into the upper surface of the semiconductor layer structure 150 will not pass all the way through the n-type source regions 142, thereby ensuring that the doping concentration of the p-wells 132 is not materially impacted by this ion implantation step. P-type dopant ions are simultaneously implanted into the upper portion 182 of each trench shielding region 180, which helps reduce the magnitude of the electric fields that are formed in the lower portion of a gate oxide layer of the device (discussed below) during reverse blocking operation. Since the implantation energy is set so that the dopant ions will not materially impact the doping concentration of the p-wells 132, it is not necessary to form an ion implantation mask that covers the source regions 142. When the dopant concentration of the upper portions 182 of the trench shielding regions 180 are increased in the manner described above, the second ion implantation process may be performed before the oxidation and removal steps described above with reference to FIGS. 3E and 3F, so that the oxidation and removal steps may remove the p-type dopants that are implanted into the sidewalls of the gate trenches 170 during both ion implantation steps.

In other cases, the sidewalls of the gate trenches 170 may be covered before the ion implantation step is performed that increases the doping concentration of the upper portions of the trench shielding regions 180. This process is shown in FIGS. 3G-3I. In particular, as shown in FIG. 3G, spacers 178 such as oxide spacers are formed on the sidewalls of the gate trenches 170. The spacers 178 may be formed in the same manner as the oxide spacers 78 discussed above with reference to FIG. 2E, so further description thereof will be omitted here. The supplemental ion implantation may then be performed to increase the dopant concentration in the upper portions 182 of the silicon carbide trench shielding regions 180, as is shown in FIG. 3H. As discussed above, this supplemental ion implantation may be a high dose, relative low energy implantation to ensure that the supplemental ion implantation does not materially change the doping concentration of the p-wells 132.

Referring to FIG. 3I, the sidewall spacers 178 may then be removed via an etching process. It should be noted that a vertical a doping profile of the well region 132 that is taken along a first axis that extends through the well region 132 in a direction is perpendicular to a plane that is parallel to a top surface of the semiconductor layer structure 150 may vary by less than 10% from a vertical doping profile of a lower portion of the trench shielding region 180 that is taken along a second axis that is parallel to the first axis and that extends through a center of the bottom of the trench 170. As discussed above, this occurs because the p-wells 132 and the trench shielding regions 180 are formed together (i.e., simultaneously) through the same ion implantation process. Here, the lower portion of the trench shielding region 180 refers to a portion the trench shielding region 180 that extends from the bottom of the trench shielding region 180 for a distance in the depth direction that is the same as the distance that the p-wells 132 extend in the depth direction. Here, "vertical" refers to a direction that is perpendicular to a plane that is parallel to a top surface of the semiconductor layer structure 150.

Referring to FIG. 3J, a gate oxide layer 172 is conformally formed on the bottom surface and sidewalls of each gate trench 170. The conformal gate oxide layer 172 may be formed by oxidizing the exposed silicon carbide via an anneal in an oxygen containing environment. Alternatively, the conformal gate oxide layer 172 may be formed by an oxide deposition step. Portions of the conformal gate oxide layer may be removed to form openings where a source contact 190 (see FIG. 3J) can connect to the source regions 142 and p-well extensions 136 (discussed below). Removal of these portions of the conformal gate oxide layer leaves a gate oxide layer 172 in each gate trench 170.

A gate electrode 174 is formed on each gate oxide layer 172. The gate electrodes 174 may substantially fill the respective gate trenches 170 in some embodiments. The gate electrodes 174 may comprise a conductive material such as, for example, polysilicon, a silicate or a metal. Inter-metal dielectric layers 176 are formed on the exposed portions of the gate oxide layers 172 and the gate electrodes 174. A source contact 190 is thereafter formed on the upper portion of the device. The source contact 190 may comprise one or more metals and is physically and electrically connected to the p-wells 132 (see discussion below with reference to FIG. 3L) and to the n-type source regions 142. The source contact 190 may comprise the source terminal of the MOSFET 100 or may be electrically connected to the source terminal. A drain contact 192 is formed on the lower surface of the substrate 110. A gate contact (not shown) is also provided that is connected to the gate electrodes 174.

As is discussed above, since the p-wells 132 and the trench shielding regions 180 are formed together (i.e., simultaneously) through the same ion implantation process (see discussion of FIG. 3D), the trench shielding regions 180 will extend a first distance in the depth direction from bottoms of the respective gate trenches 170 downwardly into the semiconductor layer structure 150 that is substantially the same as a second distance that p-wells 132 extend from a top surface of the semiconductor layer structure 150 downwardly into the semiconductor layer structure 150. For example, in some embodiments, the first distance may be within +/−10% of the second distance. In other embodiments, the first distance may be within +/−5% of the second distance. Here the first and second distances refer to the maximum depths of the p-wells 132 and the trench shielding regions 180, respectively.

FIG. 3K is a horizontal cross-section taken through the device as shown in FIG. 3J along line 3K-3K (i.e., the cross-section is taken along the top surface of the semiconductor layer structure 150. FIG. 3K shows how p-well extensions 136 are formed that extend between the p-wells 132 and the upper surface of the semiconductor layer structure 150. A series of p-well extensions 136 are provided between each pair of gate trenches 170 in the depicted embodiment with the p-well extensions 136 spaced apart from each other in the x-direction. The p-well extensions 136 may be formed by, for example, an additional ion implantation step that is not discussed above. The p-well extensions 136 may be highly doped p-type regions and may have, for example, doping concentrations that are equal to or exceed the doping concentration of the n-type source regions 142. The p-well extensions 136 provide an electrical connection between the source contact 190 and the p-wells 132.

FIG. 3L is a cross-sectional view taken along line 3L-3L of FIG. 3K that illustrates the p-well extensions 136 as well as a trench shielding region connection pattern 138 that electrically connects the illustrated trench shielding region 180 to one of the p-well extensions 136. The trench shielding region connection pattern 138 may be a highly-doped (p⁺) p-type region that is formed in a portion of one of the sidewalls of the illustrated gate trench 170. The trench shielding region connection pattern 138 may be formed by, for example, an additional ion implantation step that is not discussed above.

Figure 4A:
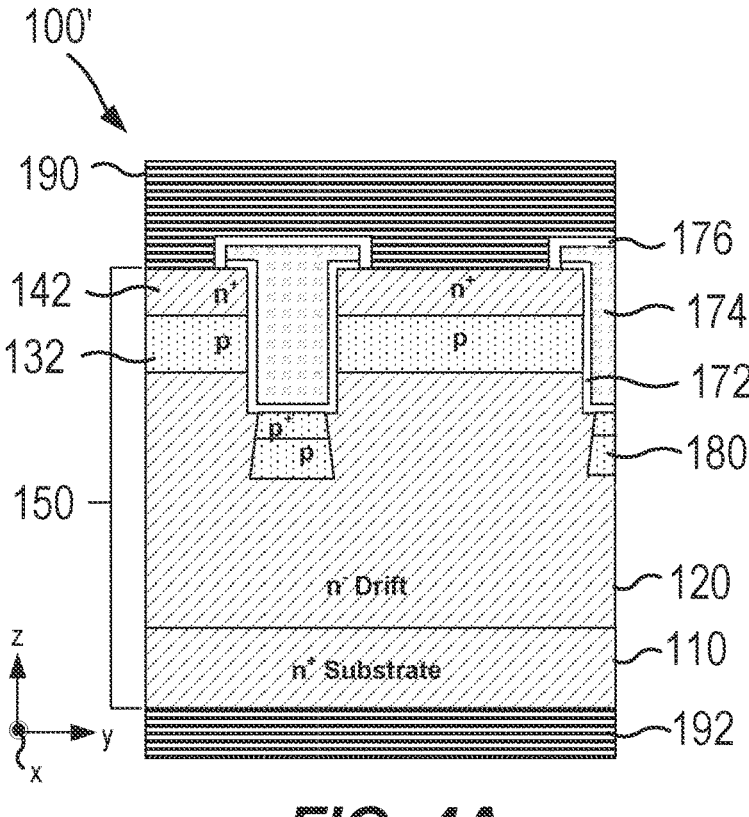
FIGS. 4A and 4B are schematic vertical cross-sectional views that illustrate a modified version of the gate trench MOSFET of FIGS. 3A-3L.
Figure 4B:
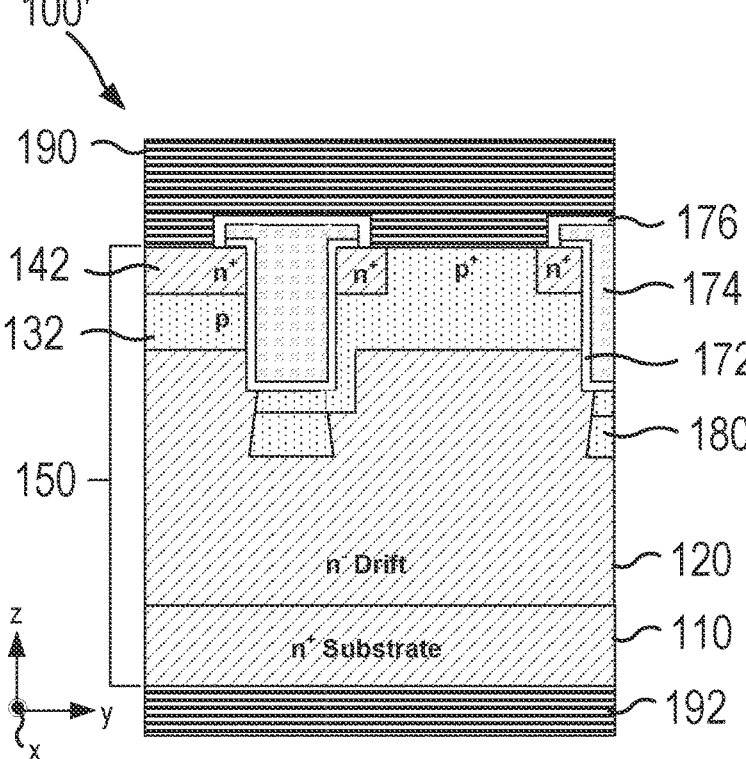

As discussed above, including the p-type trench support shields 160 in MOSFET 100 may be advantageous as they can help reduce the electric fields in the gate oxide layer 172 during reverse blocking operation and because they provide a more favorable (lower resistance) avalanche current path in the case of avalanche breakdown. However, forming the trench support shields 160 requires extra processing steps and hence increases fabrication costs, and in some applications the extra expense may outweigh the advantages of the trench support shields 160. FIGS. 4A-4B illustrate a MOSFET 100' according to further embodiments of the present invention that does not include any trench support shields 160. The MOSFET 100' can be formed using the same processing steps discussed above with reference to FIGS. 3A-3L, except that the processing steps described above with reference to FIG. 3B are omitted in the fabrication of MOSFET 100'. FIGS. 4A and 4B correspond to FIGS. 3J and 3L, respectively, with like elements numbered using the same reference numerals in these figures. Since MOSFET 100' is identical to MOSFET 100 except that the trench support shields 160 are omitted therefrom, further description of MOSFET 100' will be omitted.

Figure 5:
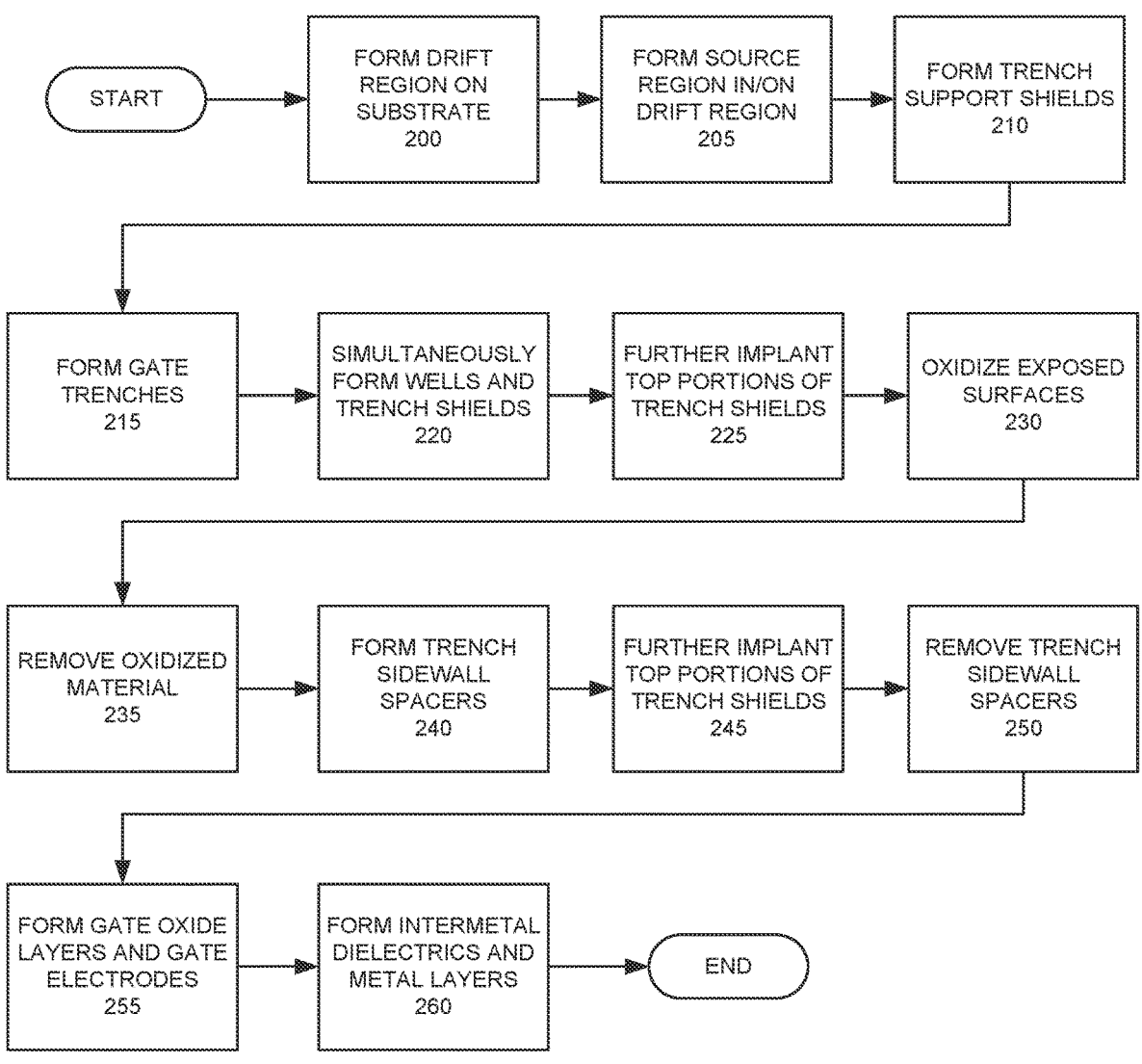
FIG. 5 is a flow chart illustrating a method of fabricating a gate trench semiconductor device according to embodiments of the present invention.

FIG. 5 is a flow chart illustrating a method according to embodiments of the present invention for fabricating a gate trench semiconductor device such as, for example, a power wide band-gap gate trench semiconductor device.

As shown in FIG. 5, operations a semiconductor drift region may be formed on a substrate (Block 200). The drift region may have a first conductivity type and may be relatively lightly doped. The drift region may be formed, for example, by epitaxial growth. Next, a source layer having the first conductivity type is formed in an upper surface of the drift region (Block 205). The source layer may be heavily doped and may be formed, for example, by ion implantation. Trench support shields are also formed (Block 210). The trench support shields may have a second conductivity type, and may be heavily doped. The trench support shields may be formed by, for example, ion implantation using an ion implantation mask. The trench support shields may be formed before or after the source layer.

Gate trenches are formed through the source layer and into the drift region (Block 215). The gate trenches may be formed by masking the device and then performing an etching process. Formation of the gate trenches may subdivide the source layer into a plurality of source regions. Each gate trench may have a depth that is less than a depth of the trench support shields. Next, an ion implantation process may be performed to blanket implant p-type dopants into the active area of the device (Block 220). This ion implantation process simultaneously forms a plurality of second conductivity type well regions underneath the source regions and a plurality of second conductivity type trench shielding regions underneath the respective trenches. The well regions and the trench shield regions may be moderately doped with second conductivity type dopants.

In some embodiments, a second ion implantation process (Block 225) may be performed immediately after the ion implantation process of Block 220. The second ion implantation may be a low energy, high dose ion implantation process that implants second conductivity type dopants into the first conductivity type source regions and into upper portions of the respective trench shielding regions. Since a low energy implantation process is performed, the second conductivity type dopant ions will substantially not pass through the source regions into the well regions, and hence will not change the doping concentration of the well regions. Moreover, since the source regions may have, for example, a first conductivity dopant concentration that is an order of magnitude greater than the second conductivity type dopants that are implanted into the source regions, the second ion implantation process may not materially change an effective doping concentration of the source regions. The second ion implantation process may be used, for example, to convert the upper portions of the trench shielding regions into heavily doped regions in order to improve the electric field blocking capabilities of the trench shielding regions.

After the above described ion implantation steps are performed, an oxidation process may be performed that oxidizes exposed surfaces of the device (Block 230). The oxidation process may involve pumping an oxygen containing gas into a chamber containing the device at an elevated temperature. The oxidation process may be carefully controlled to oxidize the sidewalls of the gate trenches a desired amount. Next, an etching process may be performed to remove the oxidized semiconductor material (Block 235). As described above, the oxidation and removal processes of Blocks 230 and 235 remove portions of the sidewalls of the gate trenches that are unintentionally doped during the ion implantation processes discussed above.

In some embodiments, the second ion implantation process discussed above with reference to Block 225 may be omitted. In such embodiments, the processes of Blocks 240, 245 and 250 may be performed. In particular, sidewall spacers such as oxide spacers may be selectively formed on the sidewalls of the gate trenches (Block 240). Then, a low energy, high dose ion implantation process is performed that implants second conductivity type dopants into the first conductivity type source regions and into upper portions of the respective trench shielding regions (Block 245). Since a low energy implantation process is performed, the second conductivity type dopant ions will substantially not pass through the source regions into the well regions, and hence will not change the doping concentration of the well regions.

Moreover, since the source regions may have, for example, a first conductivity dopant concentration that is an order of magnitude greater than the second conductivity type dopants that are implanted into the source regions, the second ion implantation process may not materially change an effective doping concentration of the source regions. The second ion implantation process may be used, for example, to convert the upper portions of the trench shielding regions into heavily doped regions in order to improve the electric field blocking capabilities of the trench shielding regions. The sidewall spacers protect the sidewalls of the gate trenches during the ion implantation process. The sidewall spacers are removed upon completion of the ion implantation process (Block 250).

Next, gate oxide layers and gate electrodes may be sequentially formed in the gate trenches (Block 255). Inter-metal dielectric layers may be formed over the gate trenches and then source and drain metallization may be formed (Block 260).

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOS-FET, IGBT, etc.). Herein, where a contact can be either a source contact or a drain contact it may be referred to as a "source/drain contact."

While the present invention is described above with respect to power MOSFET and power IGBT implementations, it will be appreciated that the techniques described herein apply equally well to other similar vertical power devices having a gate trench. Thus, embodiments of the present invention are not limited MOSFETs and IGBTs, and the techniques disclosed herein may be used on any appropriate gate trench device.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, the term "plurality" means two or more. Herein, "substantially" means within +/−10%.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating a semiconductor device, the method comprising:

providing a wide band-gap semiconductor layer structure that comprises a drift region having a first conductivity type and a source region having the first conductivity type on the drift region, the wide band-gap semiconductor layer structure comprising a trench therein; and implanting second conductivity type dopants into the wide band-gap semiconductor layer structure to simultaneously form both a well region underneath the source region and a trench shielding region underneath the trench, the well region and the trench shielding region each having a second conductivity type.

2. The method of claim 1, wherein the trench comprises a gate trench that extends through the source region and into the drift region.

3. The method of claim 1, wherein implanting second conductivity type dopants into the wide band-gap semiconductor layer structure comprises implanting the second conductivity type dopants through the source region into the drift region.

4. The method of claim 1, wherein the well region is formed by converting a portion of the drift region having the first conductivity type into the well region having the second conductivity type.

5. The method of claim 1, wherein the well region separates the source region from the drift region.

6. The method of claim 1, wherein the source region forms an upper portion of both a first sidewall and a second sidewall of the trench and the drift region forms a lower portion of the first sidewall and the second sidewall, wherein the first sidewall faces the second sidewall.

7. The method of claim 6, wherein an entirety of the first sidewall of the trench is exposed when the second conductivity type dopants are implanted into the wide band-gap semiconductor layer structure.

8. The method of claim 7, the method further comprising:

performing an oxidation process to convert at least the first and second sidewalls and a bottom of the trench into an oxide material; and removing the oxide material to convert the trench into an enlarged trench.

9. The method of claim 1, wherein the wide band-gap semiconductor layer structure extends in a length direction, a width direction and a depth direction that are perpendicular to each other, and a lower surface of the wide band-gap semiconductor layer structure extends in the length and width directions, wherein the source region extends a first distance in the depth direction and the trench shielding region extends a second distance in the depth direction, where the second distance is at least twice the first distance.

10. The method of claim 1, wherein a concentration of second conductivity type dopants in the source region is at least $5 \times 10^{15}/cm^3$.

11. The method of claim 1, wherein a doping profile of a lower portion of the trench shielding region that is taken along a first axis that extends in the depth direction through a center of the bottom of the gate trench varies by less than 15% from a doping profile of the well region that is taken along a second axis that is parallel to the first axis and that extends through the well region.

12. The method of claim 1, the method further comprising implanting additional second conductivity type dopants into the wide band-gap semiconductor layer structure underneath the trench via a different ion implantation process than an ion implantation process used to simultaneously form both the well region underneath the source region and the trench shielding region underneath the trench, where the different ion implantation process has a lower implantation energy than the ion implantation process used to simultaneously form both the well region underneath the source region and the trench shielding region underneath the trench.

13. The method of claim 12, wherein the second conductivity type dopants and the additional second conductivity type dopants are implanted using a same ion implantation mask.

14. The method of claim 12, wherein the additional second conductivity type dopants are implanted before the second conductivity type dopants are implanted.

15. The method of claim 12, the method further comprising forming a mask on sidewalls of the trench before implanting the additional second conductivity type dopants into the wide band-gap semiconductor layer structure.

16. The method of claim 12, wherein an upper surface of the source region is exposed when the additional second conductivity type dopants are implanted into the wide band-gap semiconductor layer structure.

17. The method of claim 8, the method further comprising implanting additional second conductivity type dopants into the wide band-gap semiconductor layer structure underneath the trench after the source region is formed.

18. The method of claim 12, wherein the additional second conductivity type dopants are implanted before an oxidation process is performed to convert at least the first and second sidewalls and a bottom of the trench into an oxide material.

19. The method of claim 1, wherein an upper surface of the source region is exposed when the second conductivity type dopants are implanted into the wide band-gap semiconductor layer structure.

20. The method of claim 2, wherein the trench shielding region extends the full length of the gate trench.

21. A method of fabricating a semiconductor device, the method comprising:

providing a wide band-gap semiconductor layer structure that comprises a drift region having a first conductivity type and a source region having the first conductivity type on the drift region; and then forming a gate trench in the wide band-gap semiconductor layer structure; and then performing a first ion implantation process to form a well region having a second conductivity type in the semiconductor layer structure directly underneath the source region.

22. The method of claim 21, wherein performing the first ion implantation process to form the well region having the second conductivity type in the semiconductor layer structure directly underneath the source region comprises implanting second conductivity dopants so that they penetrate through the source region to form the well region directly underneath the source region.

23. A method of fabricating a semiconductor device, the method comprising:

providing a semiconductor layer structure that comprises a drift region having a first conductivity type and a source region having the first conductivity type on the drift region;

forming a gate trench in the semiconductor layer structure; and then forming both (1) a well region having a second conductivity type underneath the source region and (2) a trench shielding region having the second conductivity type underneath the gate trench.

24. The method of claim 23, wherein the well region is formed by implanting second conductivity type dopants so that they penetrate through the source region.

25. The method of claim 23, wherein the trench shielding region extends substantially the length of the gate trench.

* * * * *